United States Patent
Song et al.

(10) Patent No.: US 9,941,154 B2
(45) Date of Patent: Apr. 10, 2018

(54) REVERSE SELF ALIGNED DOUBLE PATTERNING PROCESS FOR BACK END OF LINE FABRICATION OF A SEMICONDUCTOR DEVICE

(71) Applicant: QUALCOMM Incorporated, San Diego, CA (US)

(72) Inventors: Stanley Seungchul Song, San Diego, CA (US); Choh Fei Yeap, San Diego, CA (US); Zhongze Wang, San Diego, CA (US); John Jianhong Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 15/390,405

(22) Filed: Dec. 23, 2016

(65) Prior Publication Data

US 2017/0110364 A1    Apr. 20, 2017

Related U.S. Application Data

(62) Division of application No. 14/026,893, filed on Sep. 13, 2013, now Pat. No. 9,564,361.

(51) Int. Cl.
*H01L 21/033* (2006.01)
*H01L 21/768* (2006.01)
*H01L 23/522* (2006.01)
*H01L 23/528* (2006.01)
*H01L 23/66* (2006.01)

(52) U.S. Cl.
CPC .... *H01L 21/76816* (2013.01); *H01L 21/0335* (2013.01); *H01L 21/0337* (2013.01); *H01L 21/0338* (2013.01); *H01L 21/76877* (2013.01); *H01L 23/528* (2013.01);
(Continued)

(58) Field of Classification Search
CPC .......................... H01L 21/0337; H01L 21/0338
See application file for complete search history.

(56) References Cited

U.S. PATENT DOCUMENTS

| | | |
|---|---|---|
| 6,429,123 B1 | 8/2002 | Tseng |
| 7,531,456 B2 | 5/2009 | Kwon et al. |

(Continued)

FOREIGN PATENT DOCUMENTS

JP    2007207951 A    8/2007

OTHER PUBLICATIONS

International Preliminary Report on Patentability—PCT/US2014/054230 The International Bureau of WIPO—Geneva, Switzerland, dated Dec. 3, 2015.
(Continued)

*Primary Examiner* — Daniel Luke
(74) *Attorney, Agent, or Firm* — Toler Law Group, P.C.

(57) ABSTRACT

In a particular embodiment, a method includes forming a second hardmask layer adjacent to a first sidewall structure and adjacent to a mandrel of a semiconductor device. A top portion of the mandrel is exposed prior to formation of the second hardmask layer. The method further includes removing the first sidewall structure to expose a first portion of a first hardmask layer. The method also includes etching the first portion of the first hardmask layer to expose a second portion of a dielectric material. The method also includes etching the second portion of the dielectric material to form a first trench. The method also includes forming a first metal structure within the first trench.

15 Claims, 17 Drawing Sheets

(52) U.S. Cl.
CPC .......... H01L 23/5226 (2013.01); H01L 23/66 (2013.01); *H01L 2223/6677* (2013.01)

(56) References Cited

U.S. PATENT DOCUMENTS

| | | |
|---|---|---|
| 7,550,391 B2 | 6/2009 | Jeon et al. |
| 7,615,496 B2 | 11/2009 | Lee et al. |
| 7,718,529 B2 | 5/2010 | Deng et al. |
| 8,101,481 B1 | 1/2012 | Carlson |
| 8,450,833 B2 | 5/2013 | Kim |
| 2008/0085581 A1 | 4/2008 | Kim et al. |
| 2008/0305636 A1 | 12/2008 | Kim et al. |
| 2009/0215272 A1 | 8/2009 | Sadjadi et al. |
| 2009/0298291 A1 | 12/2009 | Lee et al. |
| 2010/0055922 A1 | 3/2010 | Kim et al. |
| 2010/0130016 A1 | 5/2010 | Devilliers |
| 2011/0113393 A1 | 5/2011 | Sezginer |
| 2011/0115000 A1 | 5/2011 | Yang |
| 2012/0058640 A1 | 3/2012 | Kim et al. |
| 2012/0282751 A1 | 11/2012 | Oh et al. |
| 2013/0032885 A1 | 2/2013 | Swamynathan et al. |
| 2013/0122709 A1 | 5/2013 | Liaw |
| 2015/0076704 A1 | 3/2015 | Song et al. |

OTHER PUBLICATIONS

International Search Report and Written Opinion—PCT/US2014/054230—ISA/EPO—dated Jul. 20, 2015.

REVERSE SELF ALIGNED DOUBLE PATTERNING PROCESS FOR BACK END OF LINE FABRICATION OF A SEMICONDUCTOR DEVICE

I. CROSS-REFERENCE TO RELATED APPLICATIONS

The present application claims priority from U.S. patent application Ser. No. 14/026,893 filed on Sep. 13, 2013, the contents of which is expressly incorporated by reference in its entirety.

II. FIELD

The present disclosure is generally related to forming a semiconductor device using a reverse self aligned double patterning (SADP) process.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Electronic devices may include one or more semiconductor devices that enable such computing capabilities and other functionalities. Fabrication of a semiconductor device may include forming one or more metal structures (e.g., metal layers or interconnections of the semiconductor device) during "back-end-of-line" (BEOL) stages of the fabrication. One process for forming the one or more metal structures is known as self aligned double patterning (SADP). During the SADP process, a mandrel may be used to form a metal structure. The metal structure may have a size (e.g., a width) that corresponds to a width of the mandrel, and the size of the metal structure may be varied by varying the width of the mandrel. A distance (e.g., a space) between the metal structure and another metal structure may correspond to a width of a sidewall structure that is formed on a side wall of the mandrel during the SADP process. In order to vary a distance between two metal structures, a complex cut/block mask or multiple masks may be used to vary a width of the sidewall structure. However, using the complex cut/block mask or the multiple masks adds complexity and thus cost to the fabrication of the semiconductor device.

IV. SUMMARY

A process of forming one or more metal structures, such as metal layers or metal interconnections, of a semiconductor device is disclosed. The process may include a reverse SADP process performed during a BEOL stage of fabrication of the semiconductor device. The process may include using multiple hardmask layers during formation of the one or more metal structures. For example, one or more mandrels may be formed on a first hardmask layer and sidewall structures may be formed on side walls of each mandrel. The one or more mandrels may be maintained (e.g., may not be removed, as compared to a typical SADP process) after forming the sidewall structures. A portion, such as a top surface, of the one or more maintained mandrels may be exposed prior to forming a second hardmask layer on the first hardmask layer. After formation of the second hardmask layer, the sidewall structures may be removed. The one or more maintained mandrels, the first hardmask layer, the second hardmask layer, or a combination thereof, may be used as etch masks during performance of one or more etches. Performing the one or more etches may form trenches at locations of the sidewall structures, and the one or more metal structures may be formed in the trenches.

By forming the one or more metal structures in this manner, a size (e.g., a width) of a particular metal structure may be associated with a size (e.g., a width) of a particular sidewall structure to which the particular metal structure corresponds. A first distance (e.g., a space) between two metal structures of a particular set of metal structures, such as two metal structures corresponding to two sidewall structures of a particular mandrel, may correspond to a width of the particular mandrel. A second distance between two metal structures of a second set of metal structures may correspond to a second width of a second mandrel used in forming the second set of metal structures. By varying widths of the one or more mandrels, distances (e.g., the first distance and the second distance) between metal structures of different sets of metal structures may be varied without using a complex cut/block mask or multiple masks during the fabrication process.

The reverse SADP process may also include removing a particular maintained mandrel along with the sidewall structures of the particular maintained mandrel after forming the second hardmask layer. Removing the particular maintained mandrel and the sidewall structures of the particular maintained mandrel may expose a portion of the first hardmask layer. The one or more etches may be performed on the portion of the first hardmask layer to form a trench having a different width. A different metal structure may be formed in the trench, such that a width of the different metal structure corresponds to the different width and is different than widths of the two metal structures associated with the particular mandrel. By removing the particular maintained mandrel and the sidewall structures of the particular maintained mandrel after forming the second hardmask layer, the reverse SADP process may enable formation of multiple metal structures having different widths and having different distances between the metal structures of different sets of metal structures.

In a particular embodiment, a method includes forming a second hardmask layer adjacent to a first sidewall structure and adjacent to a mandrel of a semiconductor device. A top portion of the mandrel is exposed prior to formation of the second hardmask layer. The method further includes removing the first sidewall structure to expose a first portion of a first hardmask layer. The method further includes etching the first portion of the first hardmask layer to expose a second portion of a dielectric material. The method also includes etching the second portion of the dielectric material to form a first trench. The method further includes forming a first metal structure within the first trench.

In another particular embodiment, an apparatus includes a semiconductor device. The semiconductor device includes a first hardmask layer coupled to a dielectric material of the semiconductor device. The semiconductor device further includes a mandrel coupled to the first hardmask layer. A top portion of the mandrel is exposed. The semiconductor device further includes a sidewall structure coupled to the first hardmask layer and adjacent to the mandrel. The semiconductor device also includes a second hardmask layer coupled to the first hardmask layer. The second hardmask layer is adjacent to the mandrel and the sidewall structure.

In another particular embodiment, a non-transitory computer-readable medium includes processor-executable instructions that, when executed by a processor, cause the processor to initiate formation of a semiconductor device. The semiconductor device is formed by a method that includes forming a second hardmask layer adjacent to a sidewall structure and a mandrel of the semiconductor device. A top portion of the mandrel is exposed prior to formation of the second hardmask layer. The method further includes removing the sidewall structure to expose a first portion of a first hardmask layer. The method further includes etching the first portion of the first hardmask layer to expose a second portion of a dielectric material. The method also includes etching the second portion of the dielectric material to form a trench. The method further includes forming a metal structure within the trench.

In another particular embodiment, an apparatus includes means for providing a first etch mask coupled to a dielectric material of a semiconductor device. The apparatus further includes means for transferring a first pattern to the means for providing the first etch mask. The means for transferring the first pattern is coupled to the means for providing the first etch mask. A top portion of the means for transferring the first pattern is exposed. The apparatus further includes means for transferring a second pattern to the means for providing a first etch mask. The means for transferring the second pattern is coupled to the means for providing the first etch mask. The means for transferring the second pattern is adjacent to the means for transferring the first pattern. The apparatus also includes means for providing a second etch mask coupled to the means for providing the first etch mask. The means for providing the second etch mask is adjacent to the means for transferring the first pattern and the means for transferring the second pattern.

One particular advantage provided by at least one of the disclosed embodiments is that distances between two metal structures of different sets of metal structures formed by the reverse SADP process may be varied without using a complex cut/block mask or multiple masks to form the metal structures. By utilizing the reverse SADP process, cost and complexity are reduced as compared to the complex cut/block mask or the multiple mask fabrication techniques. Another advantage is that the widths of the metal structures and distances between metal structures of different sets of metal structures may be varied.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
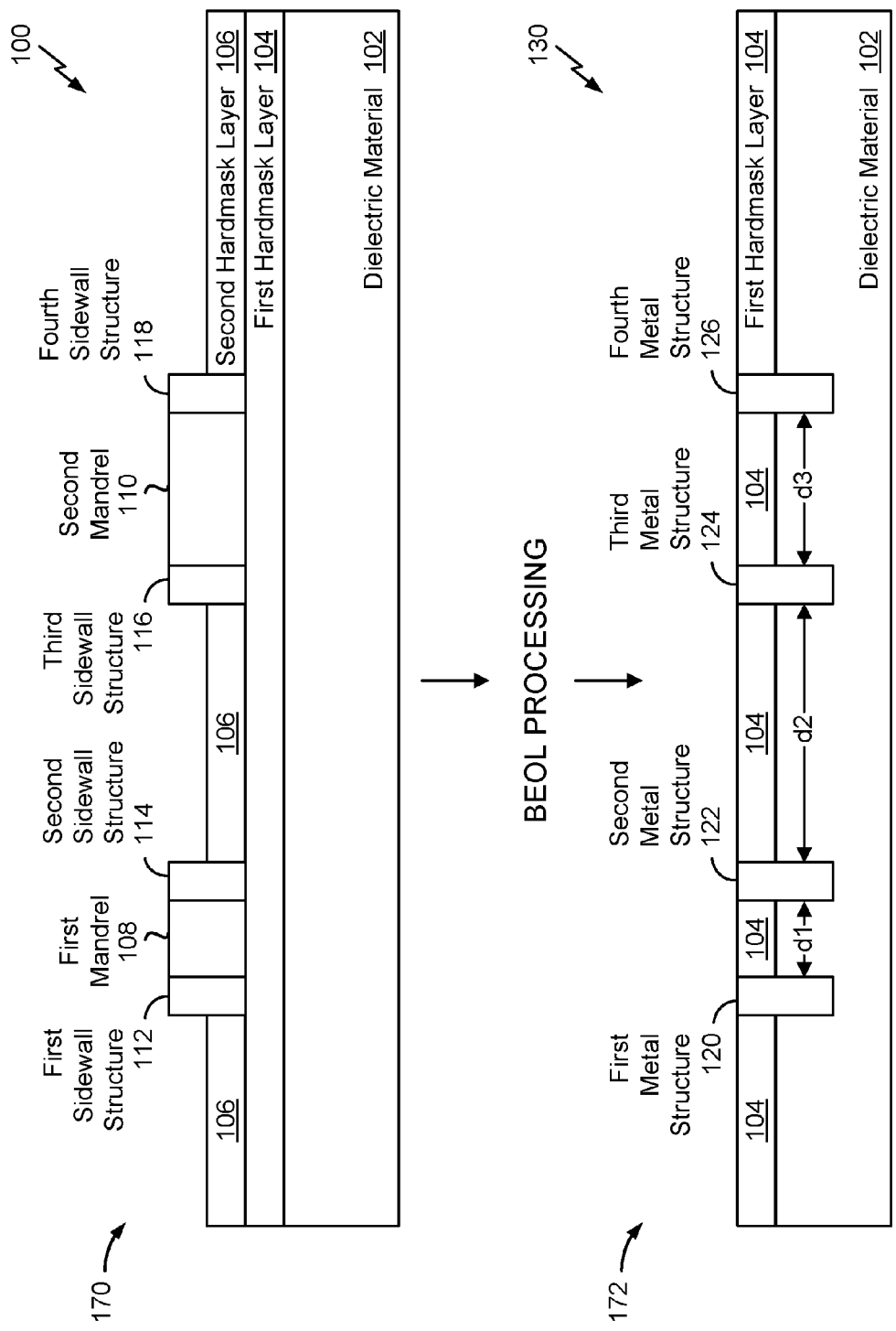
FIG. 1 is a diagram illustrating two stages of a first process to fabricate a semiconductor device.

Referring to FIG. 1, two stages, such as a first stage 100 and a second stage 130, of a first process to fabricate a semiconductor device are depicted. The semiconductor device may include an integrated circuit. A first semiconductor device structure 170 and a second semiconductor device structure 172 may be formed during respective stages of the fabrication process. In a particular embodiment, the second semiconductor device structure 172 represents the semiconductor device formed by the first process. The first process may include a first reverse self aligned double patterning (SADP) process performed during a back-end-of-line (BEOL) fabrication stage of the semiconductor device.

During the first stage 100, the first semiconductor device structure 170 may include a dielectric material 102, a first hardmask layer 104, a second hardmask layer 106, mandrels 108, 110, and sidewall structures 112-118. The first hardmask layer 104 may be coupled to the dielectric material 102, to the mandrels 108, 110, and to the sidewall structures 112-118.

The sidewall structures 112-118 may be adjacent to the mandrels 108, 110. For example, a first sidewall structure 112 may be adjacent to a first mandrel 108 when the first sidewall structure 112 is located in a first position that is proximate to (e.g., adjoining) a second position of the first mandrel 108. At least one surface of the first sidewall structure 112 may be in contact with at least one surface of the first mandrel 108 when the first sidewall structure 112 is adjacent to the first mandrel 108. For example, the first mandrel 108 may be positioned between the first sidewall structure 112 and a second sidewall structure 114, and a second mandrel 110 may be positioned between a third sidewall structure 116 and a fourth sidewall structure 118. Each of the sidewall structures 112-118 may be adjacent to a corresponding surface (e.g., sidewall) of the mandrels 108, 110, as depicted in the first stage 100 of FIG. 1. For example, each of the sidewall structures 112-118 may be in contact with a corresponding surface of the mandrels 108, 110.

A top portion of at least one of the mandrels 108, 110 may be exposed. For example, a top portion of the first mandrel 108 may be exposed, such that the top portion may not be covered by the sidewall structures 112-118 or a second hardmask layer 106. The top portion of the first mandrel 108 may be opposite to a bottom surface of the first mandrel 108 that is in contact with the first hardmask layer 104. A top portion of the second mandrel 110 may be similarly exposed.

The second hardmask layer 106 may be coupled to the first hardmask layer 104 and may be adjacent to the sidewall structures 112-118. The second hardmask layer 106 may be located on or above the first hardmask layer 104. For example, the second hardmask layer 106 may be positioned between the sidewall structures 112-118 on the first hardmask layer 104, as depicted in the first stage 100 of FIG. 1. The second hardmask layer 106 may be positioned between and may be in contact with corresponding surfaces of the second sidewall structure 114 and the third sidewall structure 116 when the second hardmask layer 106 is adjacent to the second sidewall structure 114 and the third sidewall structure 116. For example, the second hardmask layer 106 may be positioned proximate to and may be in contact with a first right surface of the second sidewall structure 114 and a first left surface of the third sidewall structure 116. As another example, the second hardmask layer 106 may also be positioned to proximate to and may be in contact with a second left surface of the first sidewall structure 112 and a second right surface of the fourth sidewall structure 118.

In a particular embodiment, when a single sidewall structure is formed on each of the mandrels 108, 110, the second hardmask layer 106 may be adjacent to the mandrels 108, 110. For example, the second hardmask layer 106 may be positioned adjacent (e.g., proximate) to a surface of and may be in contact with the mandrels 108, 110 when a single sidewall structure is formed on each of the mandrels 108, 110. For example, when the first sidewall structure 112 is formed on the first mandrel 108 and the second sidewall structure 114 is not formed, the second hardmask layer 106 may be adjacent to a right surface of the first mandrel 108. Formation of the mandrels 108, 110, the sidewall structures 112-118, the first hardmask layer 104, and the second hardmask layer 106 is described further herein with reference to FIGS. 2-5.

During the second stage 130, the second semiconductor device structure 172 may be formed based on the first semiconductor device structure 170 during the BEOL fabrication stage. For example, the first semiconductor device structure 170 may undergo BEOL processing (e.g., one or more stages of the first reverse SADP process), which may result in formation of the second semiconductor device structure 172, as described further herein with reference to FIGS. 6-9. The second semiconductor device structure 172 may include the dielectric material 102, the first hardmask layer 104, and metal structures 120-126. Each of the metal structures 120-126 may be formed at a location based on a corresponding sidewall structure of the sidewall structures 112-118 of the first semiconductor device structure 170. For example, a first metal structure 120 may be formed at a location beneath the first sidewall structure 112, and a first width of the first metal structure 120 may correspond to a first sidewall width of the first sidewall structure 112. Widths and locations of the metal structures 122-126 may similarly correspond to widths and locations of the sidewall structures 114-118, respectively.

Multiple metal structures, such as the metal structures 120-126 may be formed by applying one or more steps of the first reverse SADP process to multiple sidewall structures, such as the sidewall structures 112-118 of the first stage 100, as described further herein with reference to FIGS. 6-9. For example, the first sidewall structure 112 may be removed from the first semiconductor device structure 170 and one or more etches may be performed to form a trench at a location of the first sidewall structure 112 (prior to removal). For example, the first sidewall structure 112 may be removed to expose a first portion of the first hardmask layer 104. The first portion of the first hardmask layer 104 may be etched, such as during a first etch, to expose a second portion of the dielectric material 102. The second portion of the dielectric material 102 may be etched, such as during a second etch, to form a first trench. The first metal structure 120 may be formed within the first trench. Each of the metal structures 122-126 may be similarly formed. For example, the sidewall structures 114-118 may be removed and the one or more etches (e.g., the first etch and the second etch) may be performed to form multiple trenches. The multiple trenches may include the first trench. The sidewall structures 122-126 may be formed within the multiple trenches. Accordingly, the metal structures 120-126 may be formed during the BEOL fabrication stages (e.g., during the BEOL processing) of the semiconductor device.

Distances between metal structures of different sets of the metal structures 120-126 may be different (e.g., varied). For example, a first set of metal structures 120, -122 may correspond to the first mandrel 108, and a second set of metal structures may correspond to the second mandrel 110. A distance d1 between the first metal structure 120 and the second metal structure 122 may be different than a distance d3 between the third metal structure 124 and the fourth metal structure 126. The distances between the metal structures of different sets of the metal structures 120-126 may also be different from a distance between a metal structure from one set of metal structures and another metal structure from a different set of metal structures. For example, the distance d3 may be different from a distance d2 between the second metal structure 122 and the third metal structure 124. As another example, the distance d1 may be less than the distance d3 and the distance d3 may be less than the distance d2. As another example, the distances d1, d2, and d3 may be the same distance.

The second semiconductor device structure 172 may undergo additional stages of BEOL processing (not shown) to form the semiconductor device of the first reverse SADP process. As one example, at least a portion of the dielectric material 102 may undergo planarization to expose one or more bottom surfaces of the metal structures 120-126. Accordingly, the metal structures may be coupled to other structures or devices through multiple surfaces, such as a top surface and a bottom surface. Other additional stages of BEOL processing may be performed based on intended functionality of the semiconductor device.

During operation of the semiconductor device, the metal structures 120-126 may be biased according to operation of the semiconductor device. The metal structures 120-126 may be coupled to one or more other circuit elements, structures, or other semiconductor devices. For example, the first metal structure 120 may be coupled to a first circuit element and a second circuit element. The first metal structure 120 may be biased such that an electric current flows from the first circuit element to the second circuit element via the first metal structure 120. The metal structures 122-126 may be similarly coupled and biased according to operation of the semiconductor device.

By forming the second semiconductor device structure 172 having the metal structures 120-126 using the first reverse SADP process, distances between metal structures of different sets of the metal structures 120-126 may be controlled without using a complex cut/block mask or multiple masks during the fabrication process. Thus, cost and complexity are reduced as compared to the complex cut/block mask or the multiple mask fabrication techniques while enabling distances between metal structures of different sets of the metal structures 120-126 to be different (e.g., varied).

Figure 2:
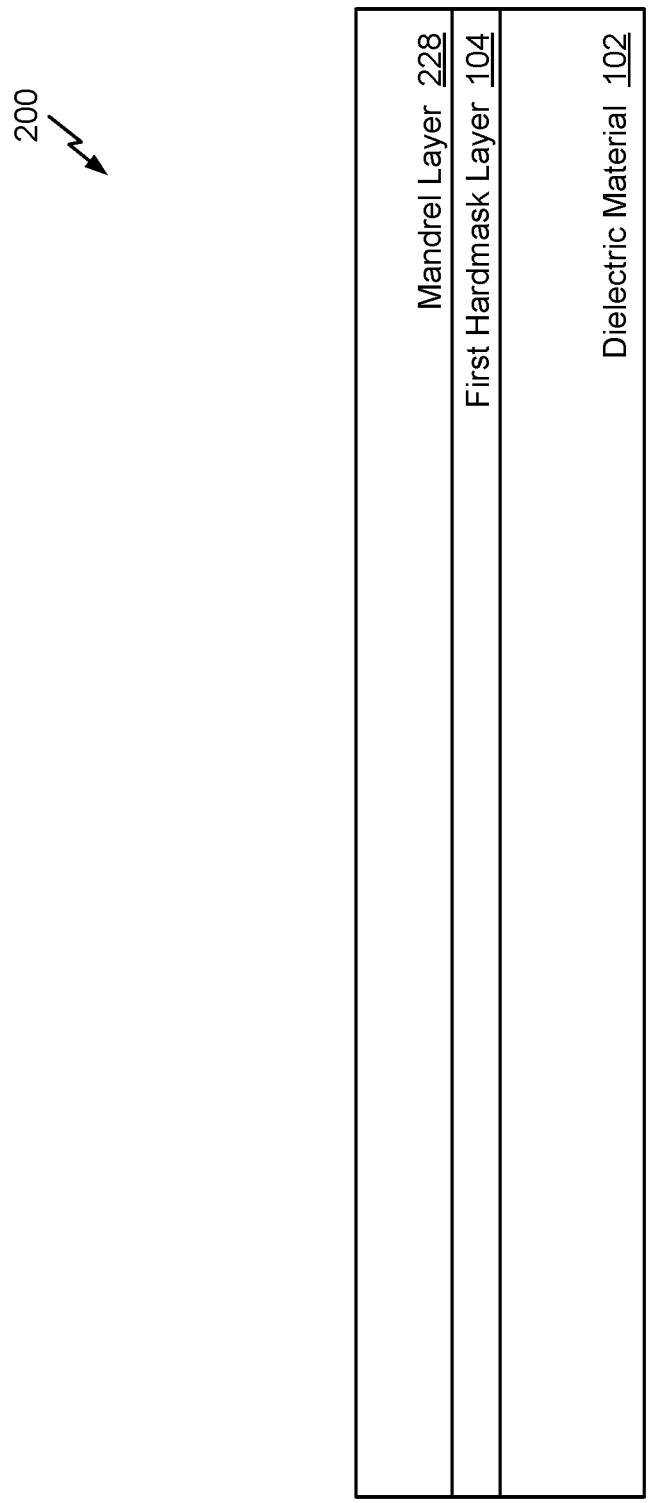
FIG. 2 is a first illustrative diagram of a first stage of a second process to fabricate a semiconductor device.

Referring to FIG. 2, a first illustrative diagram of a first stage of a second process to fabricate a semiconductor device is depicted and generally designated 200. For example, the second process may include a second reverse SADP process. The second process may correspond to the first process, as described with reference to FIG. 1.

During the first stage 200, a semiconductor device structure may include the dielectric material 102, the first hardmask layer 104, and a mandrel layer 228. The first hardmask layer 104 may be formed on the dielectric material 102, such as an inter-metal dielectric (IMD). The dielectric material 102 may be included in or on a substrate (not shown) of the semiconductor device being formed by the second reverse SADP process. The first hardmask layer 104 may include silicon (Si) or any material suitable for providing an etch mask. The mandrel layer 228 may be formed on the first hardmask layer 104. The mandrel layer 228 may be any material suitable for transferring a pattern to the first hardmask layer 104 during a photolithographic process or an etch process. The mandrel layer 228, the first hardmask layer 104, and the dielectric material 102 may each be different materials. Alternately, one or more of the mandrel layer 228, the first hardmask layer 104, and the dielectric material 102 may be a same material. Although three layers are illustrated, one or more intermediate layers may be included in the semiconductor device structure between the dielectric material 102 and the first hardmask layer 104 and/or the first hardmask layer 104 and the mandrel layer 228.

Figure 3:
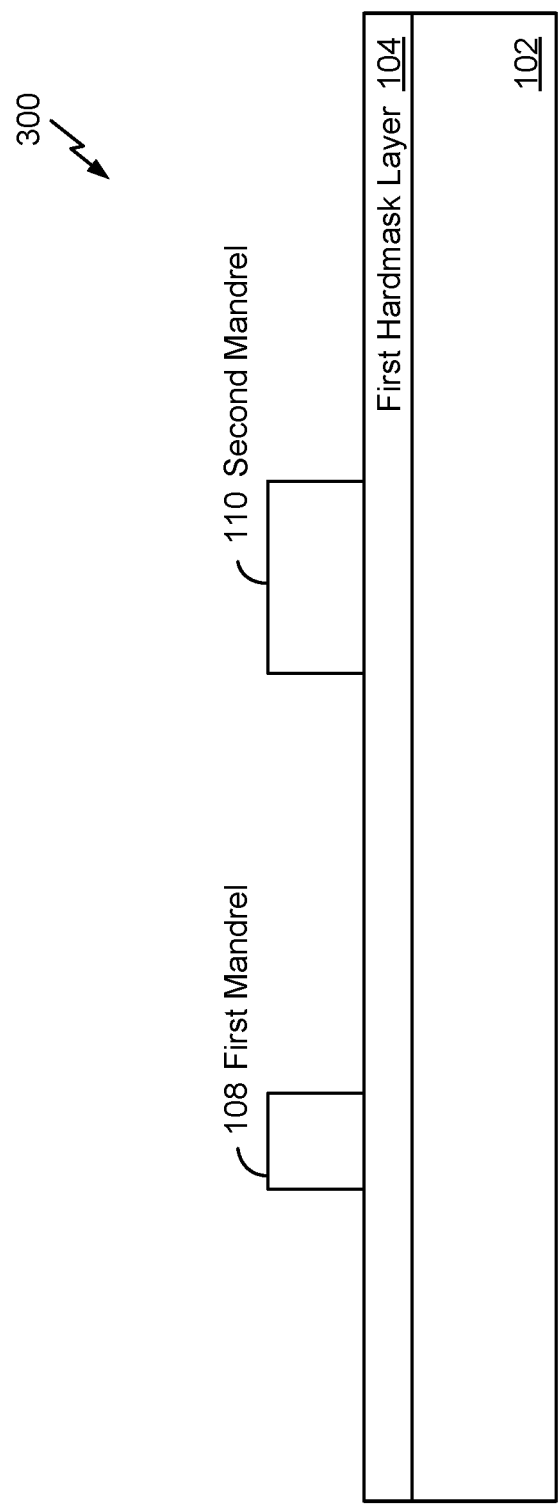
FIG. 3 is a second illustrative diagram of a second stage of the second process to fabricate a semiconductor device after forming one or more mandrels.

Referring to FIG. 3, a second illustrative diagram of a second stage of the second process to fabricate a semiconductor device after forming one or more mandrels is depicted and generally designated 300. The mandrels 108, 110 may be formed on the first hardmask layer 104 from the mandrel layer 228 of FIG. 2. The mandrels 108, 110 may be formed by removing portions of the mandrel layer 228 of FIG. 2 using a lithographic mask. For example, the lithographic mask may define the mandrels 108, 110 in the mandrel layer 228. Although described as mandrels, the mandrels 108-, 110 may include mandrel patterns, mask patterns, dummy structures, or any other structure suitable for transferring a pattern to the first hardmask layer 104. Although two mandrels 108, 110 are shown, any number of mandrels may be formed. The mandrels 108, 110 may have the same width or different widths. For example, a first width of the first mandrel 108 may be less than a second width of the second mandrel 110.

Figure 4:
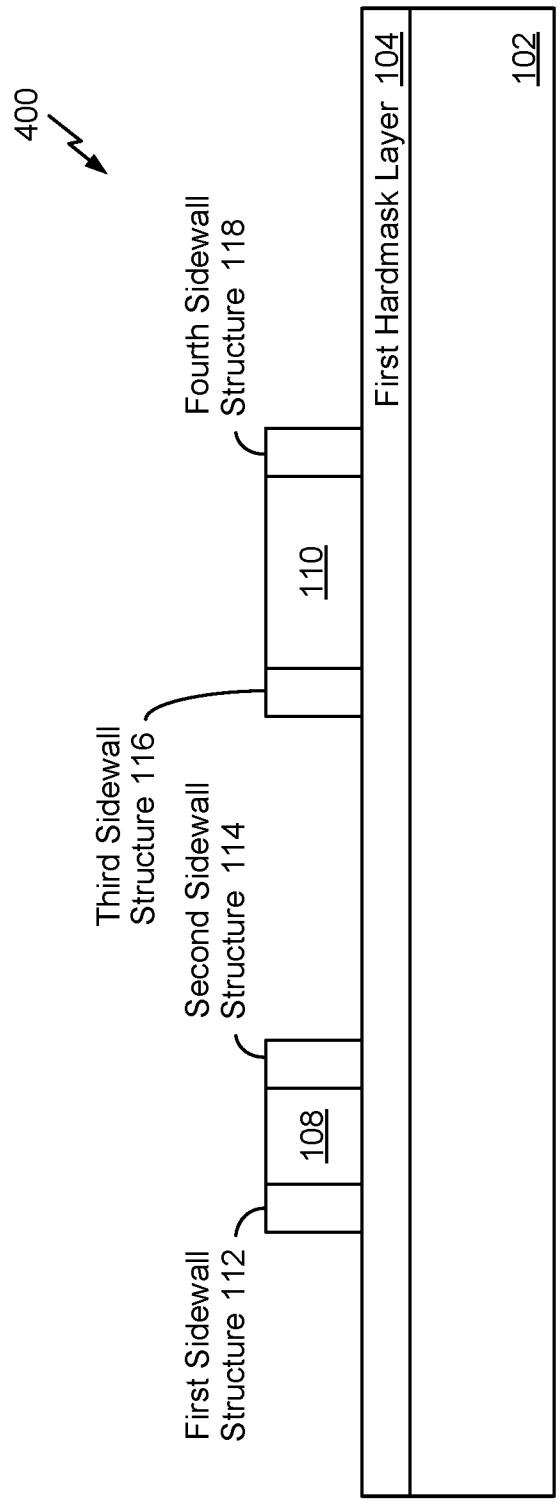
FIG. 4 is a third illustrative diagram of a third stage of the second process to fabricate a semiconductor device after forming one or more sidewall structures.

Referring to FIG. 4, a third illustrative diagram of a third stage of the second process to fabricate a semiconductor device after forming one or more sidewall structures is depicted and generally designated 400. Sidewall material may be applied to each of the mandrels 108, 110 of FIG. 4 to form the sidewall structures 112-118. For example, a first sidewall structure 112 and a second sidewall structure 114 may be formed on opposite side walls of the first mandrel 108 (e.g., the first mandrel 108 may be between the first sidewall structure 112 and the second sidewall structure 114). As another example, a third sidewall structure 116 and a fourth sidewall structure 118 may be formed on opposite side walls of the second mandrel 110. Although forming two sidewall structures on each of the mandrels 108, 110 is described, a single sidewall structure may be formed on the mandrels 108, 110. For example, the first mandrel 108 may have a single sidewall structure, such as the first sidewall structure 112 or the second sidewall structure 114.

The sidewall structures 112-118 may be formed using a thin-film deposition process where a thin-film material is applied to the side walls of the mandrels 108, 110. A width of each of the sidewall structures 112-118 may be substantially equal, within tolerances associated with variations caused by manufacturing processes, based on the thin-film material used to form the sidewall structures 112-118. For example, a first width of the first sidewall structure 112 may be within a −0.5 nanometer to +0.5 nanometer range of a second width of the second sidewall structure 114.

Figure 5:
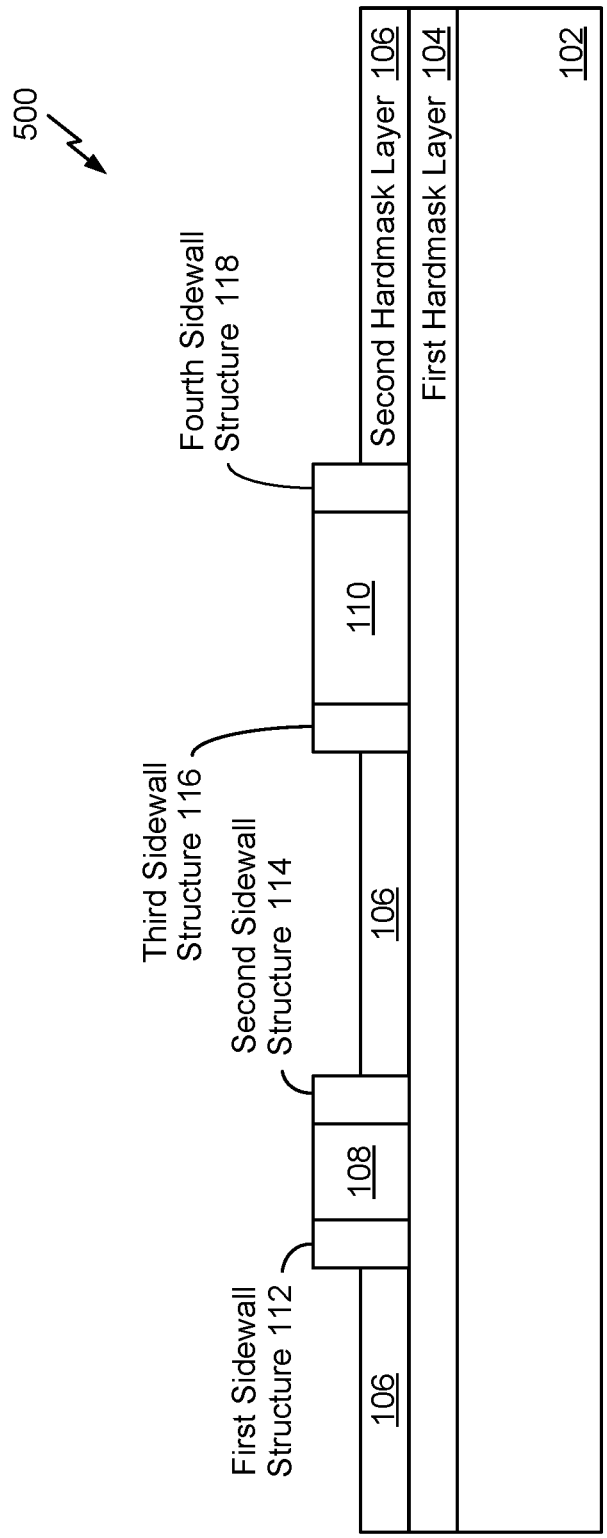
FIG. 5 is a fourth illustrative diagram of a fourth stage of the second process to fabricate a semiconductor device after forming a second hardmask layer.

Referring to FIG. 5, a fourth illustrative diagram of a fourth stage of the second process to fabricate a semiconductor device after forming a second hardmask layer is depicted and generally designated 500. The fourth stage 500 may correspond to the first stage 100 of FIG. 1.

A second hardmask layer 106 may be formed on the first hardmask layer 104. For example, the second hardmask layer 106 may be formed on an exposed surface of the first hardmask layer 104. The second hardmask layer 106 may be formed adjacent to the sidewall structures 112-118. For example, the second hardmask layer 106 may be formed (e.g., positioned) between sidewall structures, such as between the second sidewall structure 114 and the third sidewall structure 116. The second hardmask layer 106 may also be positioned along one side of the first sidewall structure 112 and along one side of the fourth sidewall structure 118, as illustrated in FIG. 5. For example, when a single sidewall structure, such as the first sidewall structure 112, is formed on the first mandrel 108, the second hardmask layer 106 is formed along (e.g., adjacent to) an opposite side of the first mandrel 108 from the first sidewall structure 112.

The second hardmask layer 106 may be formed using a "bottom-up" fabrication technique. For example, the second hardmask layer 106 may be formed on (e.g., above or over) at least a portion of the first hardmask layer 104. The second hardmask layer 106 may not be formed on (e.g., above or over) the mandrels 108, 110 or the sidewall structures 112-118. Accordingly, top portions of the mandrels 108, 110 and the sidewall structures 112-118 may remain exposed after formation of the second hardmask layer 106. The second hardmask layer 106 may be formed on an exposed portion of the first hardmask layer 104 or on an exposed portion of an intervening layer above the first hardmask layer 104. Because the second hardmask layer 106 is formed using the "bottom-up" fabrication technique, a chemical-mechanical planarization (CMP) process or etch process performed in other fabrication processes to remove or "etch back" a portion of the second hardmask layer 106 may not be used as part of the second reverse SADP process.

As an illustrative example, the second hardmask layer 106 may be formed according to a flowable chemical vapor deposition (FCVD) fabrication technique. As another illustrative example, the second hardmask layer 106 may be formed according to a spin-on fabrication technique, or other "bottom-up" fabrication techniques. The second hardmask layer 106 may be any material suitable for use with the "bottom-up" fabrication technique. For example, the second hardmask layer 106 may be silicon dioxide ($SiO_2$). The first hardmask layer 104 and the second hardmask layer 106 may be the same material or different materials.

Figure 6:
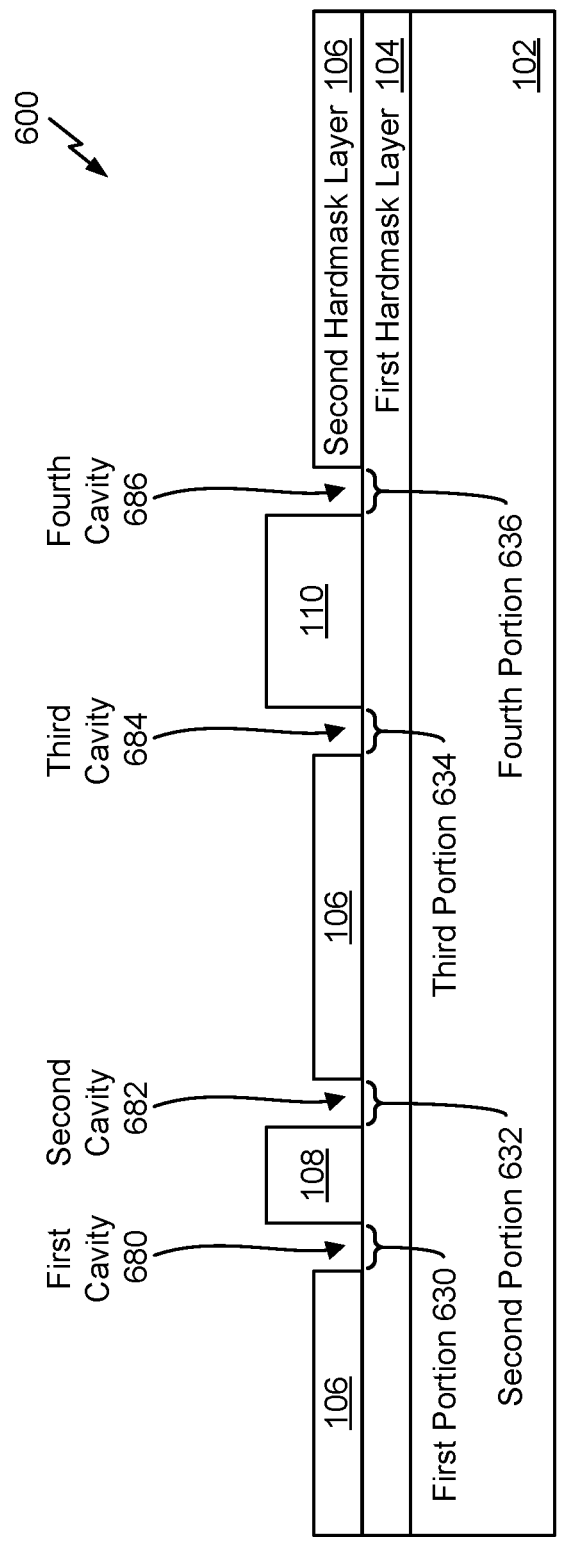
FIG. 6 is a fifth illustrative diagram of a fifth stage of the second process to fabricate a semiconductor device after removing one or more sidewall structures.

Referring to FIG. 6, a fifth illustrative diagram of a fifth stage of the second process to fabricate a semiconductor device after removing one or more sidewall structures is depicted and generally designated 600. The sidewall structures 112-118 may be removed to expose portions 630-636 of the first hardmask layer 104. For example, the sidewall structures 112-118 may be removed by etching, dissolving, or other removal processes. The portions 630-636 of the first hardmask layer 104 may be located in one or more cavities 680-686 formed by removing the sidewall structures 112-118. For example, a first portion 630 of the first hardmask layer 104 may be located in a first cavity 680 formed by removing the first sidewall structure 112, a second portion 632 of the first hardmask layer 104 may be located in a second cavity 682 formed by removing the second sidewall structure 114, a third portion 634 of the first hardmask layer 104 may be located in a third cavity 684 formed by removing the third sidewall structure 116, and a fourth portion 636 of the first hardmask layer 104 may be located in a fourth cavity 686 formed by removing the fourth sidewall structure 118. Multiple mandrels, such as the mandrels 108, 110, may be maintained after the sidewall structures 112-118 are removed. For example, the mandrels 108, 110 may not be removed prior to or during removal of the sidewall structures 112-118.

Figure 7:
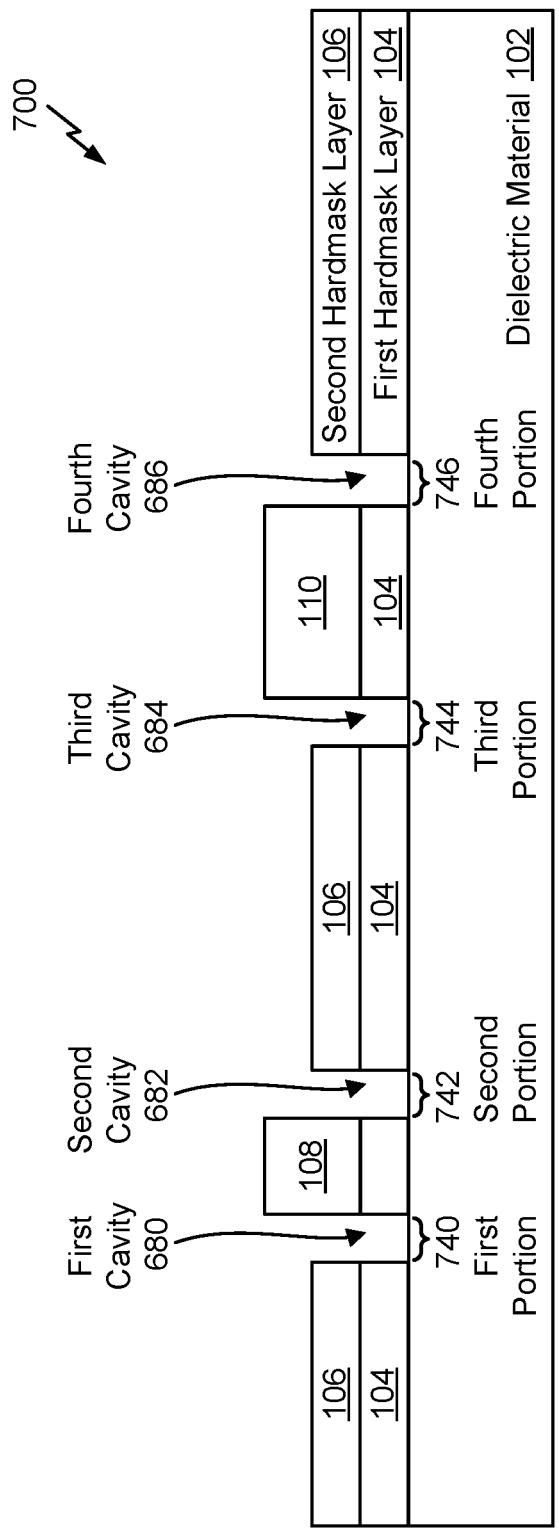
FIG. 7 is a sixth illustrative diagram of a sixth stage of the second process to fabricate a semiconductor device after performing a first etch.

Referring to FIG. 7, a sixth illustrative diagram of a sixth stage of the second process to fabricate a semiconductor device after performing the first etch is depicted and generally designated 700. The first etch may be performed on the portions 630-636 of the first hardmask layer 104 to extend the cavities 680-686. The mandrels 108, 110 and the second hardmask layer 106 may function as etch masks during the first etch. The first portions 630-636 of the first hardmask layer 104 may be removed during the first etch.

Removing the portions 630-636 may extend the cavities 680-686 and expose portions 740-746 of the dielectric material 102. The portions 740-746 of the dielectric material 102 may be located in the cavities 680-686. For example, a first portion 740 of the dielectric material 102 may be located in the first cavity 680 extended by removing the first portion 630 of the first hardmask layer 104, a second portion 742 of the dielectric material 102 may be located in the second cavity 682 extended by removing the second portion 632 of the first hardmask layer 104, a third portion 744 of the dielectric material 102 may be located in the third cavity 684 extended by removing the third portion 634 of the first hardmask layer 104, and a fourth portion 746 of the dielectric material 102 may be located in the fourth cavity 686 extended by removing the fourth portion 636 of the first hardmask layer 104.

Figure 8:
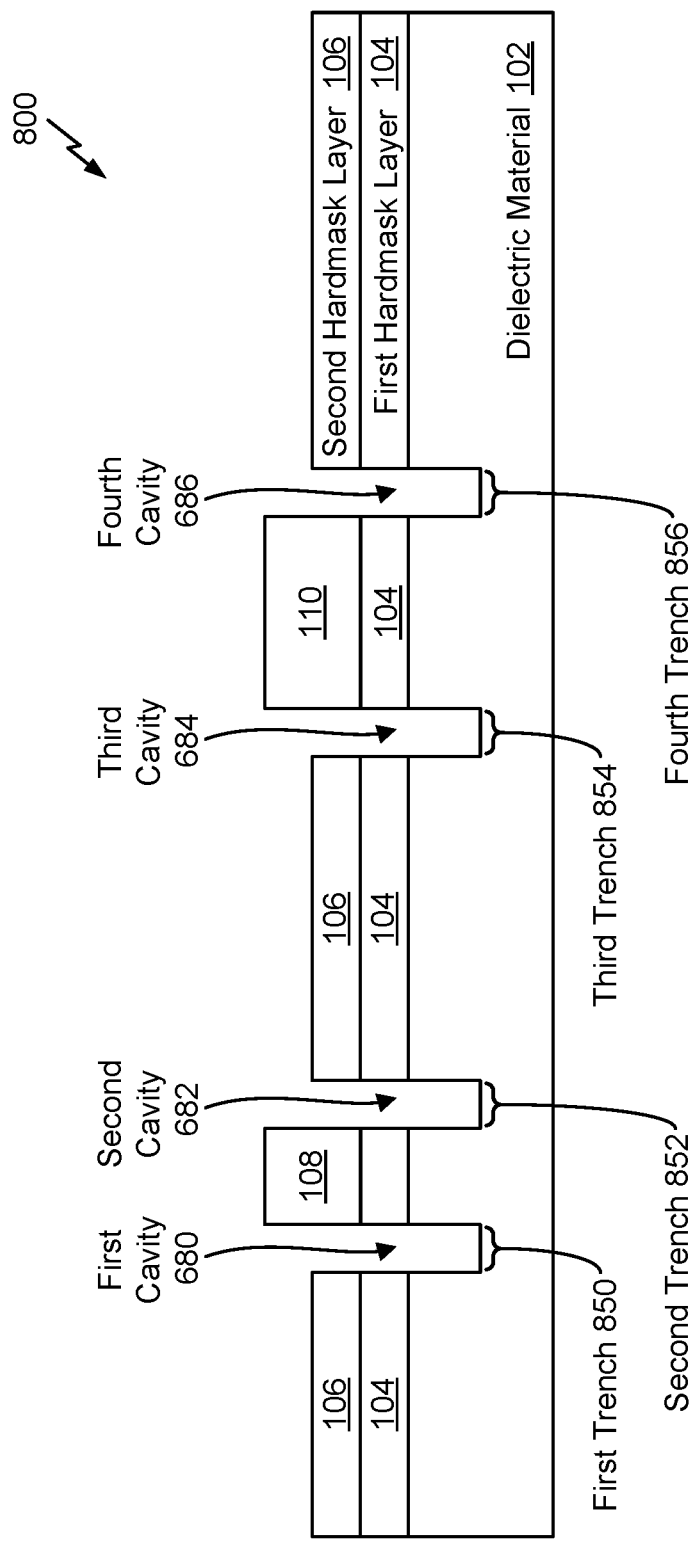
FIG. 8 is a seventh illustrative diagram of a seventh stage of the second process to fabricate a semiconductor device after performing a second etch.

Referring to FIG. 8, a seventh illustrative diagram of a seventh stage of the second process to fabricate a semiconductor device after performing the second etch is depicted and generally designated 800. The second etch may be performed on the portions 740-746 of the dielectric material 102 to extend the cavities 680-686 and to form trenches 850-856. The second hardmask layer 106, the mandrels 108, 110, a remaining portion of the first hardmask layer 104, or a combination thereof, may function as etch masks so that the second etch removes the portions 740-746 of the dielectric material 102. The portions 740-746 of the dielectric material 102 may be removed during the second etch.

Removing the portions 740-746 of the dielectric material 102 may extend the cavities 680-686 and form the trenches 850-856 in the dielectric material 102. The trenches 850-856 may be formed in and extend the cavities 680-686. For example, the first portion 740 of the dielectric material 102 may be removed to form a first trench 850, the second portion 742 of the dielectric material 102 may be removed to form a second trench 852, the third portion 744 of the dielectric material 102 may be removed to form a third trench 854, and the fourth portion 746 of the dielectric material 102 may be removed to form a fourth trench 856. Accordingly, the trenches 850-856 may correspond to positions (e.g., locations) of the sidewall structures 112-118 of FIGS. 4-5.

The second hardmask layer 106 may be removed before, during, or after formation of the trenches 850-856. The second hardmask layer 106 may be etched to remove the second hardmask layer 106 prior to forming any metal structures. For example, the second hardmask layer 106 may be removed during the first etch, during the second etch, or after forming the trenches 850-856. The second hardmask layer 106 may be removed by etching (e.g., the first etch, the second etch, or a different etch), by dissolving, by performing a chemical-mechanical planarization (CMP) process, or by performing some other removal process.

The mandrels 108, 110 may be removed after formation of the trenches 850-856. For example, the mandrels 108, 110 may be removed by etching (e.g., the first etch, the second etch, or a different etch), by dissolving, by performing a CMP process, or by performing some other removal process as part of removing the second hardmask layer 106 or separately.

Figure 9:
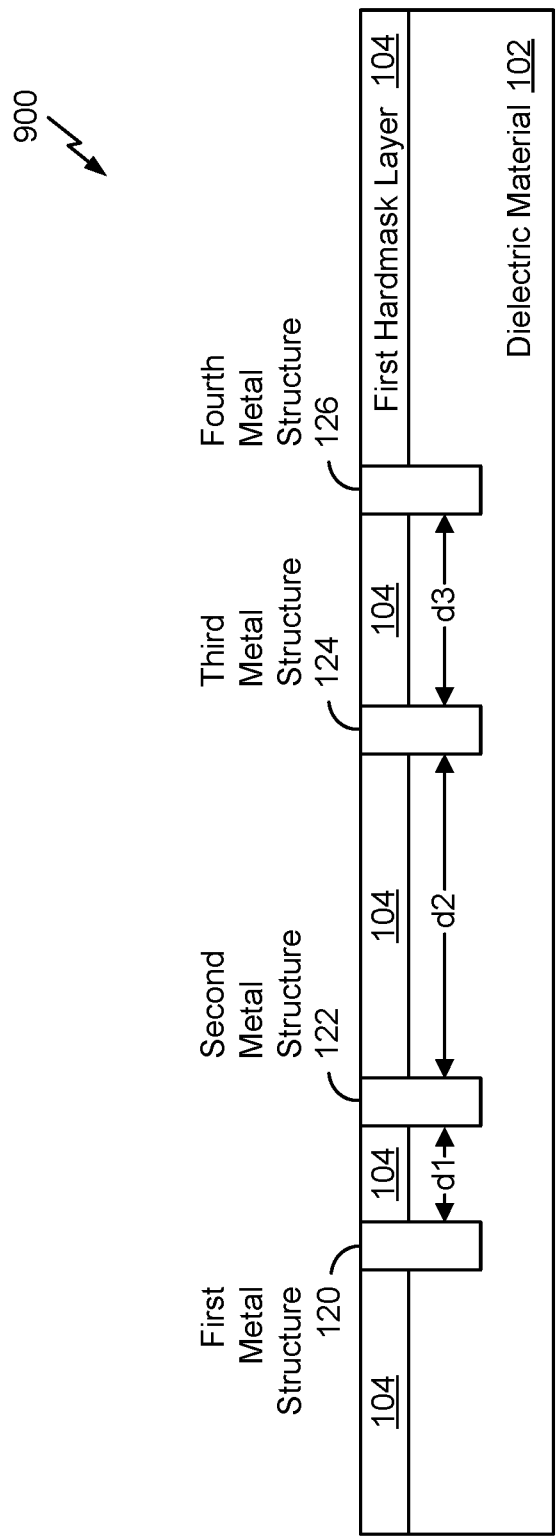
FIG. 9 is an eighth illustrative diagram of an eighth stage of the second process to fabricate a semiconductor device after forming one or more metal structures.

Referring to FIG. 9, an eighth illustrative diagram of an eighth stage of the second process to fabricate a semiconductor device after forming one or more metal structures is depicted and generally designated 900. The eighth stage 900 may correspond to the second stage 130 of FIG. 1.

The metal structures 120-126 may be formed within the trenches 850-856 of FIG. 8. For example, the first trench 850, the second trench 852, the third trench 854, and the fourth trench 856 may be filled with a material to form the first metal structure 120, the second metal structure 122, the third metal structure 124, and the fourth metal structure 126, respectively. The material may be copper, a different metal, a metal alloy, another conductive material, or a combination thereof. Although four metal structures 120-126 are shown, any number of metal structures may be formed based on the number of sidewall structures formed during the second reverse SADP process.

The metal structures 120-126 may be formed at least partially within the trenches 850-856. For example, the metal structures 120-126 may be formed entirely within the trenches 850-856 (e.g., in the cavities 680-686 in the dielectric material 102), as illustrated in FIG. 9. As another example, the metal structures 120-126 may extend above (e.g., outside of) the trenches 850-856. The first hardmask layer 104 may be removed after forming the trenches 850-856 or after forming the metal structures 120-126. For example, the first hardmask layer 104 may be removed by etching (e.g., the first etch, the second etch, or a different etch), by dissolving, by performing a CMP process, or by performing some other removal process.

The metal structures 120-126 may have sizes (e.g., dimensions) that correspond to sizes of the sidewall structures 112-118 of FIGS. 4-5. For example, a first width (e.g., size) of the first metal structure 120 may be equal to a first sidewall width of the first sidewall structure 112, a second width of the second metal structure 122 may be equal to a second sidewall width of the second sidewall structure 114, a third width of the third metal structure 124 may be equal to a third sidewall width of the third sidewall structure 116, and a fourth width of the fourth metal structure 126 may be equal to a fourth sidewall width of the fourth sidewall structure 118. Because the widths of each sidewall structure of the sidewall structures 112-118 may be substantially equal (e.g., within tolerances associated with variations caused by the manufacturing process), the widths of each metal structure of the metal structures 120-126 may be substantially equal, within tolerances associated with variations caused by manufacturing processes. For example, the first width of the first metal structure 120 may be within a −0.5 nanometer to +0.5 nanometer range of the second width of the second metal structure 122.

Distances between metal structures of different sets of the metal structures 120-126 may correspond to widths of the mandrels 108, 110 of FIGS. 3-8. For example, a first set of metal structures may include the metal structures 120, 122 corresponding to the first mandrel 108 and a second set of metal structures may include the metal structures 124, 126 corresponding to the second mandrel 110. A distance d1 between the first metal structure 120 and the second metal structure 122 may correspond to a first mandrel width of the first mandrel 108, and a distance d3 between the third metal structure 124 and the fourth metal structure 126 may correspond to a second mandrel width of the second mandrel 110. Because the first mandrel width of the first mandrel 108 may be different than the second mandrel width of the second mandrel 110, the distance d1 may be different than the distance d3. For example, when the first mandrel width is less than the second mandrel width, the distance d1 is less than the distance d3. The distances between the metal structures of different sets of the metal structures 120-126 may also be different from a distance between a metal structure from one set of metal structures and another metal structure from a different set of metal structures. For example, a distance d2 between the second metal structure 122 and the third metal structure 124 may correspond to a distance between the second sidewall structure 114 and the third sidewall structure 116 of FIGS. 4-5. When the distance between the second sidewall structure 114 and the third sidewall structure 116 is different than the first mandrel width of the first mandrel 108 and the second mandrel width of the second mandrel 110, the distance d1, the distance d2, and the distance d3 may be different distances. Accordingly, the distances between metal structures of different sets of the metal structures 120-126 or between one metal structure of one set of metal structures and another metal structure of another set of metal structures may be different distances. Alternately, two or more of the distances d1-d3 may be a same distance.

During operation of the semiconductor device, the metal structures 120-126 may be biased according to operation of the semiconductor device. The metal structures 120-126 may be coupled to one or more other circuit elements, structures, or other semiconductor devices. For example, the first metal structure 120 may be coupled to a first circuit element and a second circuit element. The first metal structure 120 may be biased such that an electric current flows from the first circuit element to the second circuit element via the first metal structure 120. The metal structures 122-126 may be similarly coupled and biased according to operation of the semiconductor device.

It will be appreciated that the second reverse SADP process illustrated by FIGS. 2-9 describes a single-mask BEOL fabrication technique for forming a semiconductor device having different distances between metal structures of different sets of the metal structures 120-126. By forming the metal structures 120-126 using the second reverse SADP process of FIGS. 2-9, cost and complexity are reduced as compared to using the complex cut/block mask or the multiple mask fabrication techniques while enabling varied (e.g., different) distances between the metal structures of different sets of the metal structures 120-126.

Figure 10A:
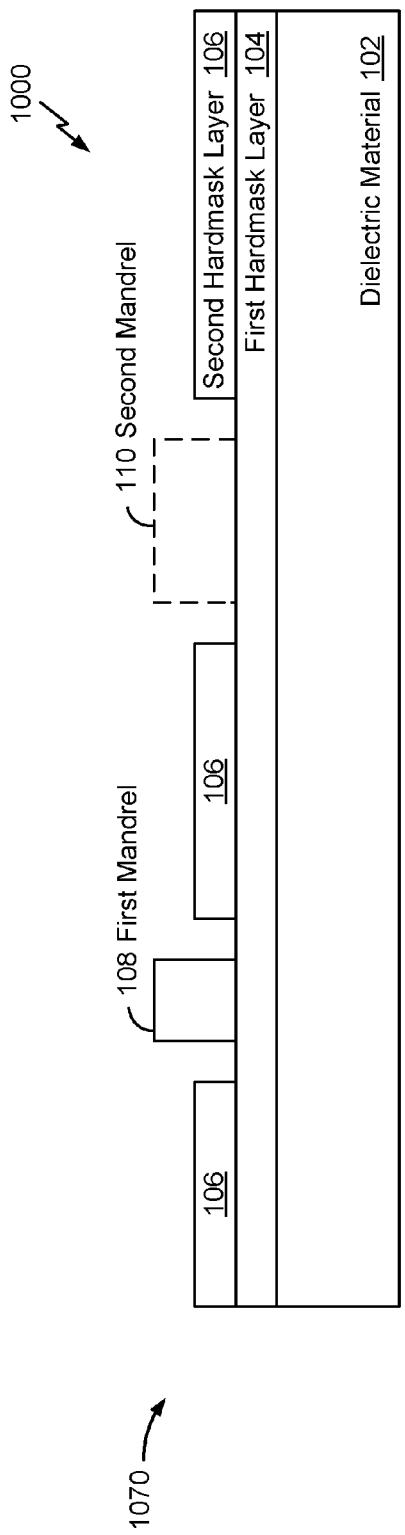
FIGS. 10A and 10B depict a first illustrative diagram and a second illustrative diagram of a first stage and a second stage of a third process to fabricate a semiconductor device.
Figure 10B:
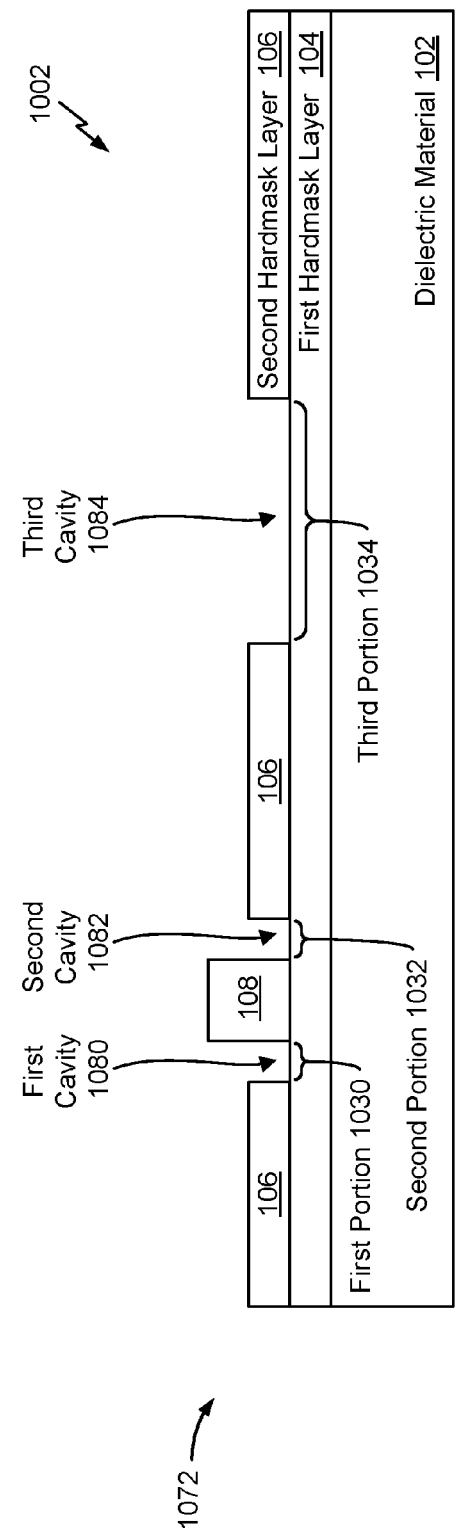

Referring to FIGS. 10A and 10B, a first illustrative diagram and a second illustrative diagram of two stages, such as a first stage 1000 and a second stage 1002 of a third process, to fabricate a semiconductor device are depicted. For example, the third process may include a third reverse SADP process. The third process may correspond to the first process of FIG. 1 or the second process of FIGS. 2-9. Although not illustrated, the third process may include stages corresponding to the first stage 100 of FIG. 1 and/or the stages 200-600 of FIGS. 2-6.

Referring to FIG. 10A, a first semiconductor device structure 1070 may include the dielectric material 102, the first hardmask layer 104, the second hardmask layer 106, and the mandrels 108, 110. The first semiconductor device structure 1070 may correspond to a semiconductor device structure formed during the fifth stage 600 of FIG. 6. For example, the first semiconductor device structure 1070 may be formed after removing the sidewall structures 112-118, as described with reference to the fifth stage 600 of FIG. 6. For example, the sidewall structures 112-118 may be removed after forming the second hardmask layer 106.

Referring to FIG. 10B, a second semiconductor device structure 1072 may be formed based on the first semiconductor device structure 1070 by removing the second mandrel 110 of the first semiconductor device structure 1070. For example, the second mandrel 110 may be removed using a second lithographic mask. Alternatively, the second mandrel 110 may be removed by etching, by dissolving, or by performing other removal processes. Thus, the second mandrel 110 and the sidewall structures of the second mandrel 110, such as the third sidewall structure 116 and the fourth sidewall structure 118, may be removed prior to performing the first etch. Although one mandrel is illustrated as being removed, any number of mandrels may be removed such that at least one mandrel remains prior to performing the first etch. Although an entirety of the second mandrel 110 is illustrated as being removed, in other examples only a portion of the second mandrel 110 may be removed.

The second mandrel 110 and the sidewall structures 112-118 of FIGS. 4-5 may be removed, such as by etching, by dissolving, or by performing other removal processes, to expose portions 1030-1034 of the first hardmask layer 104. The portions 1030-1034 of the first hardmask layer 104 may be located in one or more cavities 1080-1084 formed by removing the sidewall structures 112-118 and the second mandrel 110. For example, a first portion 1030 of the first hardmask layer 104 may be located in a first cavity 1080 formed by removing the first sidewall structure 112, a second portion 1032 of the first hardmask layer 104 may be located in a second cavity 1082 formed by removing the second sidewall structure 114, and a third portion 1034 of the first hardmask layer 104 may be located in a third cavity 1084 formed by removing the third sidewall structure 116, the fourth sidewall structure 118, and the second mandrel 110. Accordingly, removing the third sidewall structure 116, the fourth sidewall structure 118, and the second mandrel 110 may expose the third portion 1034 of the first hardmask layer 104.

Figure 11:
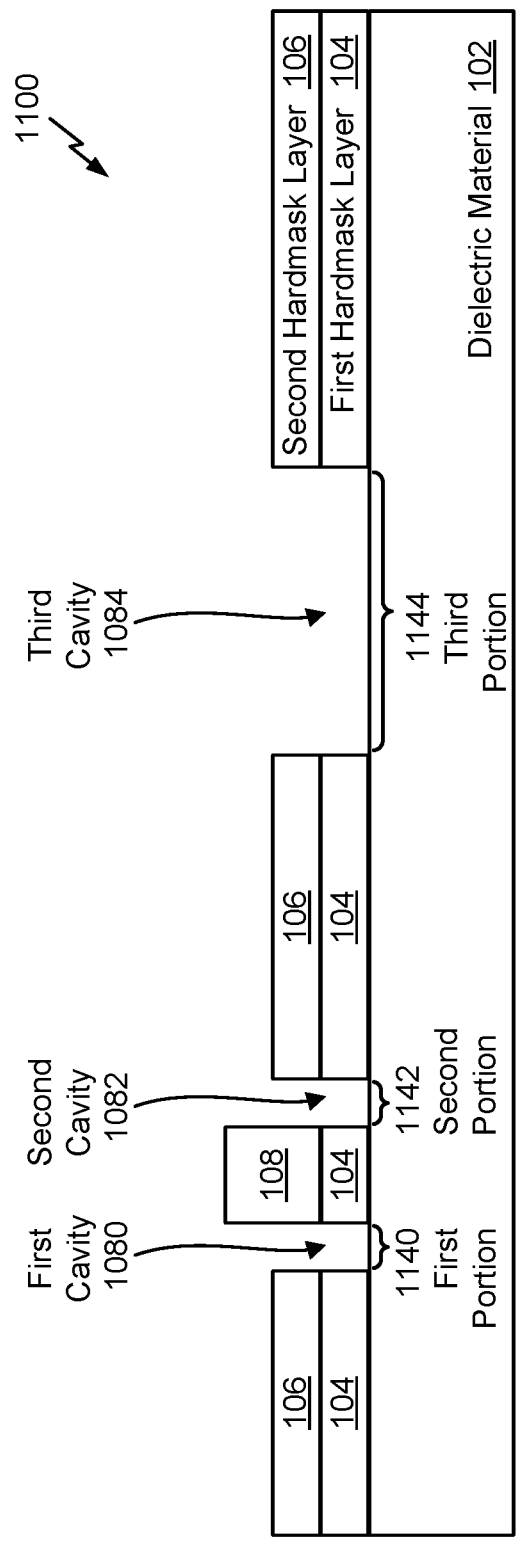
FIG. 11 is a third illustrative diagram of a third stage of the third process to fabricate a semiconductor device after performing a first etch.

Referring to FIG. 11, a third illustrative diagram of a third stage of the third process to fabricate a semiconductor device after performing the first etch is depicted and generally designated 1100. The first etch may be performed on the portions 1030-1034 of the first hardmask layer 104 to remove the portions 1030-1034 of the first hardmask layer 104. The first mandrel 108 and the second hardmask layer 106 may function as etch masks during the first etch.

Removing the portions 1030-1034 of the first hardmask layer 104 may extend the cavities 1030-1034 and expose portions 1140-1144 of the dielectric material 102. The portions 1140-1144 of the dielectric material 102 may be located in the cavities 1030-1034. For example, a first portion 1140 of the dielectric material 102 may be located in the first cavity 1080 extended by removing the first portion 1030 of the first hardmask layer 104, a second portion 1142 of the dielectric material 102 may be located in the second cavity 1082 extended by removing the second portion 1032 of the first hardmask layer 104, and a third portion 1144 of the dielectric material 102 may be located in the third cavity 1084 extended by removing the third portion 1034 of the first hardmask layer 104.

Figure 12:
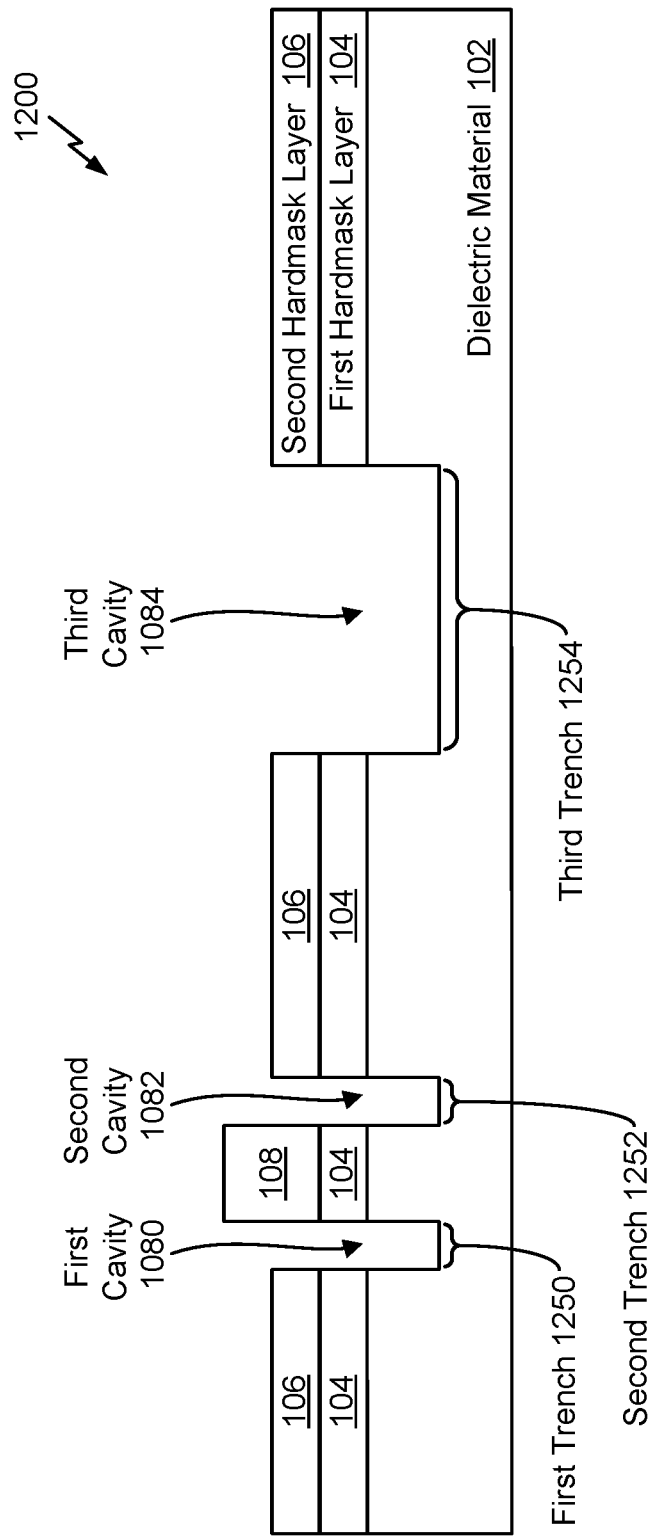
FIG. 12 is a fourth illustrative diagram of a fourth of the third process to fabricate a semiconductor device after performing a second etch.

Referring to FIG. 12, a fourth illustrative diagram of a fourth stage of the third process to fabricate a semiconductor device after performing the second etch is depicted and generally designated 1200. The second etch may be performed on the portions 1140-1144 of the dielectric material 102 to remove the portions 1140-1144 of the dielectric material 102, to extend the cavities 1030-1034, and to form trenches 1250-1254. The second hardmask layer 106, the first mandrel 108, a remaining portion of the first hardmask layer 104, or a combination thereof, may function as etch masks during the second etch.

Removing the portions 1140-1144 of the dielectric material 102 may extend the cavities 1080-1084 and form the trenches 1250-1254 in the dielectric material 102. The trenches 1250-1254 may be formed in and extend the cavities 1030-1034. For example, the first portion 1140 of the dielectric material 102 may be removed to form a first trench 1250, the second portion 1142 of the dielectric material 102 may be removed to form a second trench 1252, and the third portion 1144 of the dielectric material 102 may be removed to form a third trench 1254. Accordingly, the trenches 1250-1254 may correspond to positions (e.g., locations) of a corresponding sidewall structure or corresponding sidewall structures and mandrels.

Figure 13:
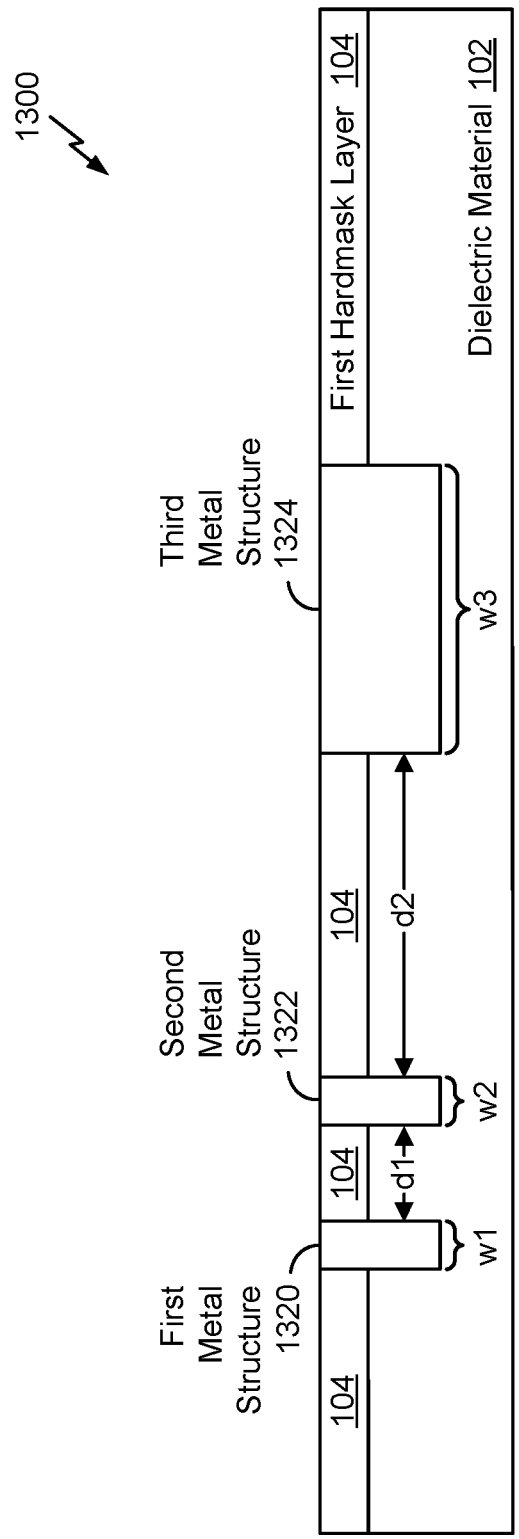
FIG. 13 is a fifth illustrative diagram of a fifth stage of the third process to fabricate a semiconductor device after forming one or more metal structures.

Referring to FIG. 13, a fifth illustrative diagram of a fifth stage of the third process to fabricate a semiconductor device after forming one or more metal structures is depicted and generally designated 1300. The fifth stage 1300 may correspond to the second stage 130 of FIG. 1 or the eighth stage 900 of FIG. 9.

Metal structures 1320-1324 may be formed within the trenches 1250-1254. For example, the first trench 1250, the second trench 1252, and the third trench 1254 may be filled with a material to form a first metal structure 1320, a second metal structure 1322, and a third metal structure 1324, respectively. The material may be copper, a different metal, a metal alloy, a conductive material or a combination thereof. The metal structures 1320-1324 may be formed during the BEOL fabrication stage of the semiconductor device. Although three metal structures 1320-1324 are shown, any number of metal structures may be formed based on the number of sidewall structures and the number of mandrels formed during the third reverse SADP process. The metal structures 1320-1324 may be formed at least partially within the trenches 1250-1254, as described with reference to the eighth stage 900 of FIG. 9. The first hardmask layer 104 may be removed after forming the trenches 1250-1254 or after forming the metal structures 1320-1324, as described with reference to the eighth stage 900 of FIG. 9.

The metal structures 1230-1324 may have sizes (e.g., dimensions) that correspond to sizes of the sidewall structures 112, 114 or to a total size of the sidewall structures 116, 118 and the second mandrel 110. For example, a first width w1 of the first metal structure 1320 may correspond to the first sidewall width of the first sidewall structure 112, a second width w2 of the second metal structure 1322 may correspond to a second sidewall width of the second sidewall structure 114, and a third width w3 of the third metal structure 1324 may correspond to a total width of the third sidewall structure 116, the fourth sidewall structure 118, and the second mandrel 110. Because the widths of the first sidewall structure 112 and the second sidewall structure 114 may be substantially equal, as explained with reference to the third stage 400 of FIG. 4, the first width w1 and the second width w2 may be substantially equal within tolerances associated with variations caused by manufacturing processes. The third width w3 may be different than the first width w1 and the second width w2. For example, the third width w3 may be greater than the first width w1 and the second width w2.

A first distance between a first set of the metal structures 1320-1324 may correspond to the first mandrel width of the first mandrel 108. For example, a distance d1 between a first set of metal structures, such as the first metal structure 1320 and the second metal structure 1322, may correspond to the first mandrel width of the first mandrel 108. The first distance between the metal structures of the first set of metal structures may be different from a second distance between one metal structure of the first set of metal structures and another metal structure that is not associated with the first set of metal structures. For example, a distance d2 between the second metal structure 1322 and the third metal structure 1324 may correspond to a distance between the second sidewall structure 114 and the third sidewall structure 116. Because the first mandrel width of the first mandrel 108 may be different than the distance between the second sidewall structure 114 and the third sidewall structure 116, the distance d1 may be different than the distance d2.

During operation of the semiconductor device, the metal structures 1320-1324 may be biased according to operation of the semiconductor device. The metal structures 1320-1324 may be coupled to one or more other circuit elements, structures, or other semiconductor devices. For example, the first metal structure 1320 may be coupled to a first circuit element and a second circuit element. The first metal structure 1320 may be biased such that an electric current flows from the first circuit element to the second circuit element via the first metal structure 1320. The metal structures 1322, 1324 may be similarly coupled and biased according to operation of the semiconductor device.

It will be appreciated that the third reverse SADP process illustrated by FIGS. 10A-B and 11-13 describes a BEOL fabrication technique for forming a semiconductor device having different widths and having different distances between metal structures of different sets of the metal structures 1320-1324. By forming the metal structures 1320-1324 according to the third reverse SADP process of FIGS. 10A-B and 11-13, the semiconductor device having the metal structures 1320-1324 may used in a greater number of implementations as compared to semiconductor devices with either the metal structures having different widths or having different distances between the metal structures 1320-1324.

Figure 14:
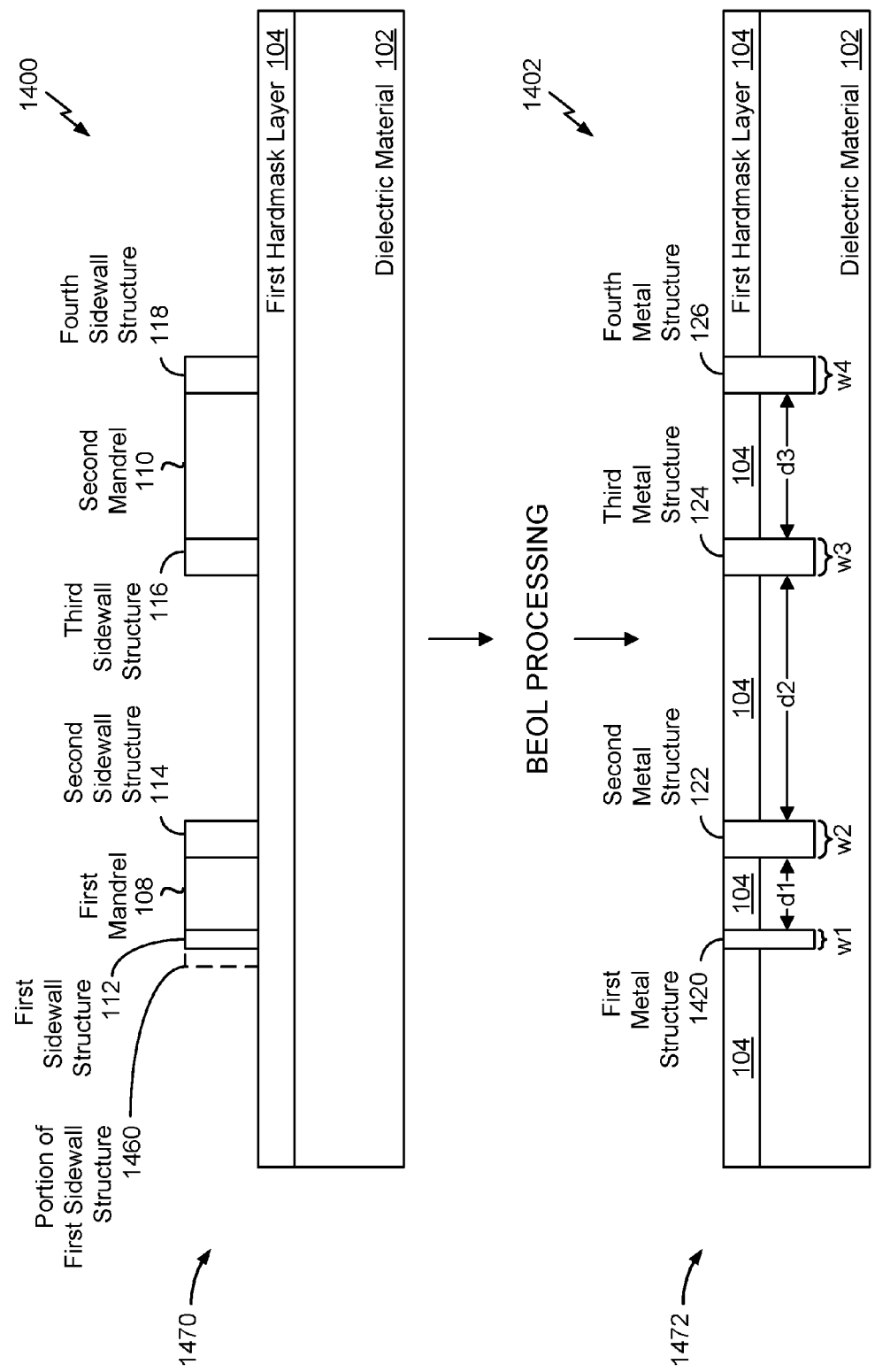
FIG. 14 is a diagram illustrating two stages of a fourth process to fabricate a semiconductor device.

Referring to FIG. 14, two stages, such as a first stage 1400 and a second stage 1402, of a fourth process to fabricate a semiconductor device are depicted. For example, the fourth process may include a fourth reverse SADP process. The fourth process may correspond to the first process of FIG. 1, the second process of FIGS. 2-9, or the third process of FIGS. 10A-B and 11-13. Although not illustrated, the fourth process may include stages corresponding to the first stage 100 of FIG. 1, the stages 200-800 of FIGS. 2-8, and/or the stages 1000-1200 of FIGS. 10A-B and 11-12. A first semiconductor device structure 1470 and a second semiconductor device structure 1472 may be formed during respective stages of the fourth process.

The first semiconductor device structure 1470 may include a dielectric material 102, a first hardmask layer 104, mandrels 108, 110, and sidewall structures 112-118. The first semiconductor device structure 1470 may correspond to a semiconductor device structure formed during the third stage 400 of FIG. 4. For example, the first semiconductor device structure 1470 may be formed after forming the sidewall structures 112-118, as described with reference to FIG. 4. A first sidewall portion 1460 of the first sidewall structure 112 may be removed prior to forming the second hardmask layer 106. For example, the first sidewall portion 1460 of the first sidewall structure 112 may be removed using a third lithographic mask. Alternatively, the first sidewall portion 1460 of the first sidewall structure 112 may be removed by etching, by dissolving, or by performing other removal processes. After removal of the first sidewall portion 1460, the first sidewall structure 112 may have a first sidewall width that is less than a second sidewall width of the second sidewall structure 114. Although a single sidewall portion is illustrated as being removed, any number of sidewall portions may be removed.

The second semiconductor device structure 1472 may be formed based on the first semiconductor device structure 1470 by performing additional stages of processing, such as processing corresponding to the stages 500-800 of FIGS. 5-8 or the stages 1000-1200 of FIGS. 10A-B and 11-12. The second semiconductor device structure 1472 may include metal structures 1420 and 122-126.

A first metal structure 1420 may have a first width w1 that is different from a second width w2 of the second metal structure 122, a third width w3 of the third metal structure 124, or a fourth width of the fourth metal structure 126. The widths w1-w4 of the metal structures 1420 and 122-126 may be equal to the sidewall widths of the corresponding sidewall structures 112-116. For example, the first width w1 of the first metal structure 1420 may be equal to the first sidewall width of the first sidewall structure 112 after removal of the first sidewall portion 1460, and the widths w2-w4 may correspond to the sidewall widths of the sidewall structures 114-118. Due to the removal of the first sidewall portion 1460, the first width w1 of the first metal structure 1420 may be less than the second width w2 of the second metal structure 122. Distances (e.g., distances d1-d3) between metal structures of different sets of the metal structures 1420 and 122-126 may be different (e.g., varied), as described with reference to FIGS. 1, 9, and 13.

During operation of the semiconductor device, the metal structures 1420 and 122-126 may be biased according to operation of the semiconductor device. The metal structures 1420 and 122-126 may be coupled to one or more other circuit elements, structures, or other semiconductor devices. For example, the first metal structure 1420 may be coupled to a first circuit element and a second circuit element. The first metal structure 1420 may be biased such that an electric current flows from the first circuit element to the second circuit element via the first metal structure 1420. The metal structures 1420 and 122-126 may be similarly coupled and biased according to operation of the semiconductor device.

It will be appreciated that the fourth reverse SADP process illustrated by FIG. 14 describes a BEOL fabrication technique for forming a semiconductor device having different widths and having different distances between metal structures of different sets of the metal structures 1420 and 122-126. By forming the metal structures 1420 and 122-126 according to the third reverse SADP process of FIGS. 10A-B and 11-13, the semiconductor device having the metal structures 1420 and 122-126 may used in a greater number of implementations as compared to semiconductor devices with either the metal structures having different widths or having different distances between the metal structures 1420 and 122-126.

Figure 15:
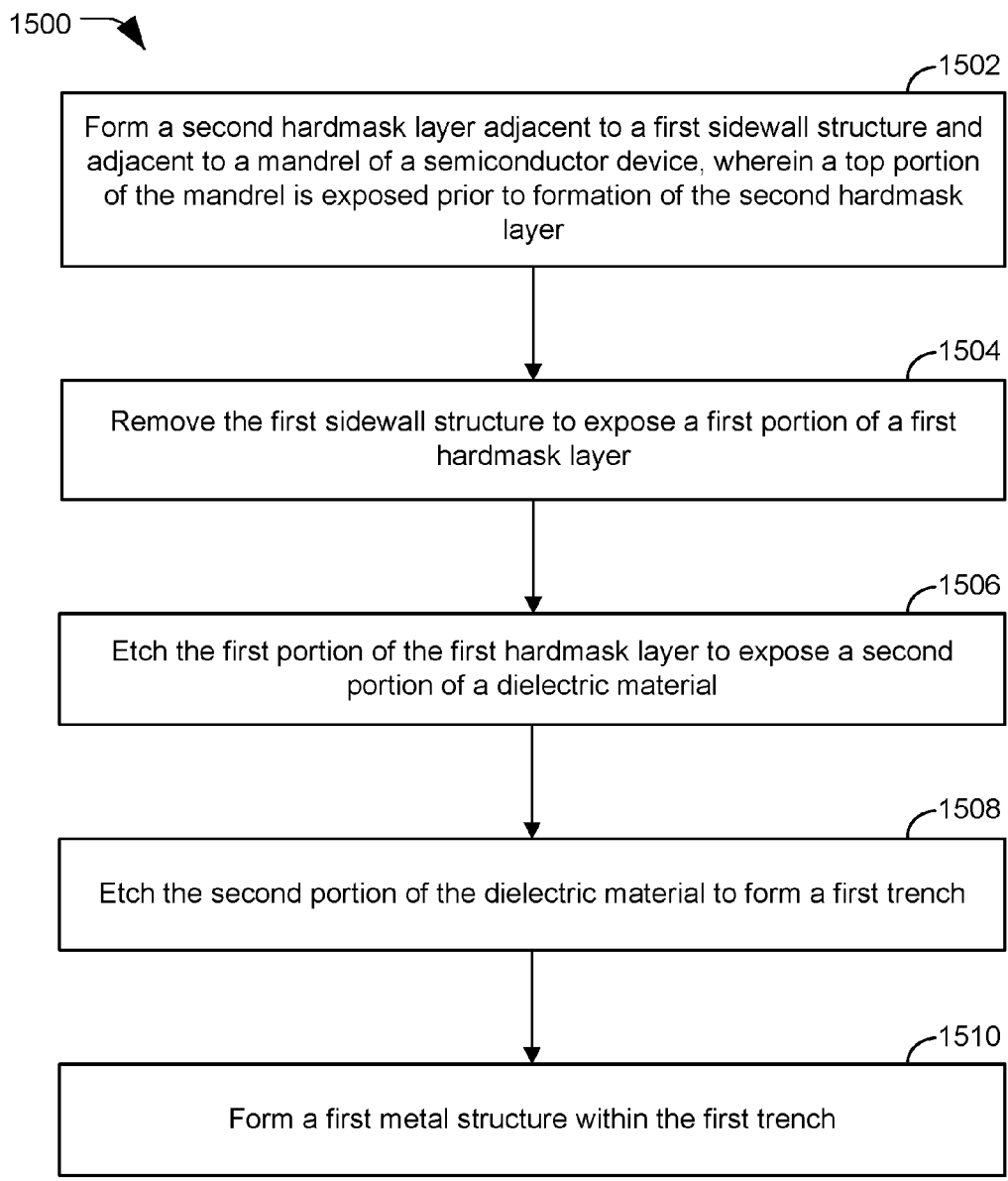
FIG. 15 is a flow chart that illustrates a particular illustrative embodiment of a method of forming a semiconductor device according to a reverse self aligned double patterning (SADP) process.

Referring to FIG. 15, a flow chart of an illustrative embodiment of a method 1500 of forming a semiconductor device according to a reverse SADP process is depicted. For example, the method 1500 may be the first SADP process described with reference to FIGS. 1-9, the second reverse SADP process described with reference to FIGS. 10A-B and 11-13, the third reverse SADP process described with reference to FIG. 14, or a combination thereof.

The method 1500 includes forming a second hardmask layer adjacent to a first sidewall structure and adjacent to a mandrel of a semiconductor device, at 1502. The second hardmask layer may be formed above a first hardmask layer, such as the first hardmask layer 104 of FIGS. 1-14. The second hardmask layer may include the second hardmask layer 106 of FIGS. 1, 5-8, 10A-B, and 11-12, the first sidewall structure may be the first sidewall structure 112 of FIGS. 1, 4-5, 10A, and 14, and the mandrel may include the first mandrel 108 of FIGS. 1, 3-8, 10A-B, 11-2, and 14. A top portion of the mandrel may be exposed prior to formation of the second hardmask layer.

The first sidewall structure may be removed to expose a first portion of the first hardmask layer, at 1504, and the first portion of the first hardmask layer may be etched to expose a second portion of a dielectric material, at 1506. The first hardmask layer may be positioned on or above the dielectric material. The dielectric material may include the dielectric material 102 of FIGS. 1-14, the first portion may include the first portion 630 of FIG. 6 or the first portion 1030 of FIG. 10, and the second portion may include the first portion 740 of FIG. 7 or the first portion 1140 of FIG. 11.

The second portion of the dielectric material may be etched to form a first trench at 1508, and a first metal structure may be formed in the first trench, at 1510. The first trench may be include first trench 850 of FIG. 8 or the first trench 1250 of FIG. 12 and the first metal structure may include the first metal structure 120 of FIGS. 1, 9, and 13, or the first metal structure 1420 of FIG. 14. Sets of metal structures may be formed using a corresponding mandrel. For example, a first set of metal structures may include the first metal structure and a second metal structure formed by using a second sidewall structure formed on a side wall of the mandrel. A second set of metal structures may be similarly formed using a different mandrel. A first distance between the first metal structure and the second metal structure may be different than a second distance between two metal structures of the second set of metal structures when a first width of the mandrel is different than a second width of the different mandrel. A third distance between the first metal structures and a third metal structure of the second set of metal structures may also be different than the first distance. For example, the first difference may be different from the third distance when a distance between corresponding sidewall structures is different than the first width of the mandrel.

By forming multiple metal structures according to the method 1500, one or more distances between metal structures of different sets of the multiple metal structures may be different (e.g., varied) without using a complex cut/block mask or multiple masks during the reverse SADP process. Thus, cost and complexity are reduced as compared to using the complex cut/block mask or the multiple masks to fabricate semiconductor devices having different distances between metal structures of different sets of the multiple metal structures.

The method 1500 of FIG. 15 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 1500 of FIG. 15 may be performed by one or more processors that execute instructions stored at a memory, such as a non-transitory computer-readable medium. The one or more processors and the memory may be integrated within equipment of a semiconductor fabrication plant to perform a fabrication process, as described further with reference to FIG. 17.

Figure 16:
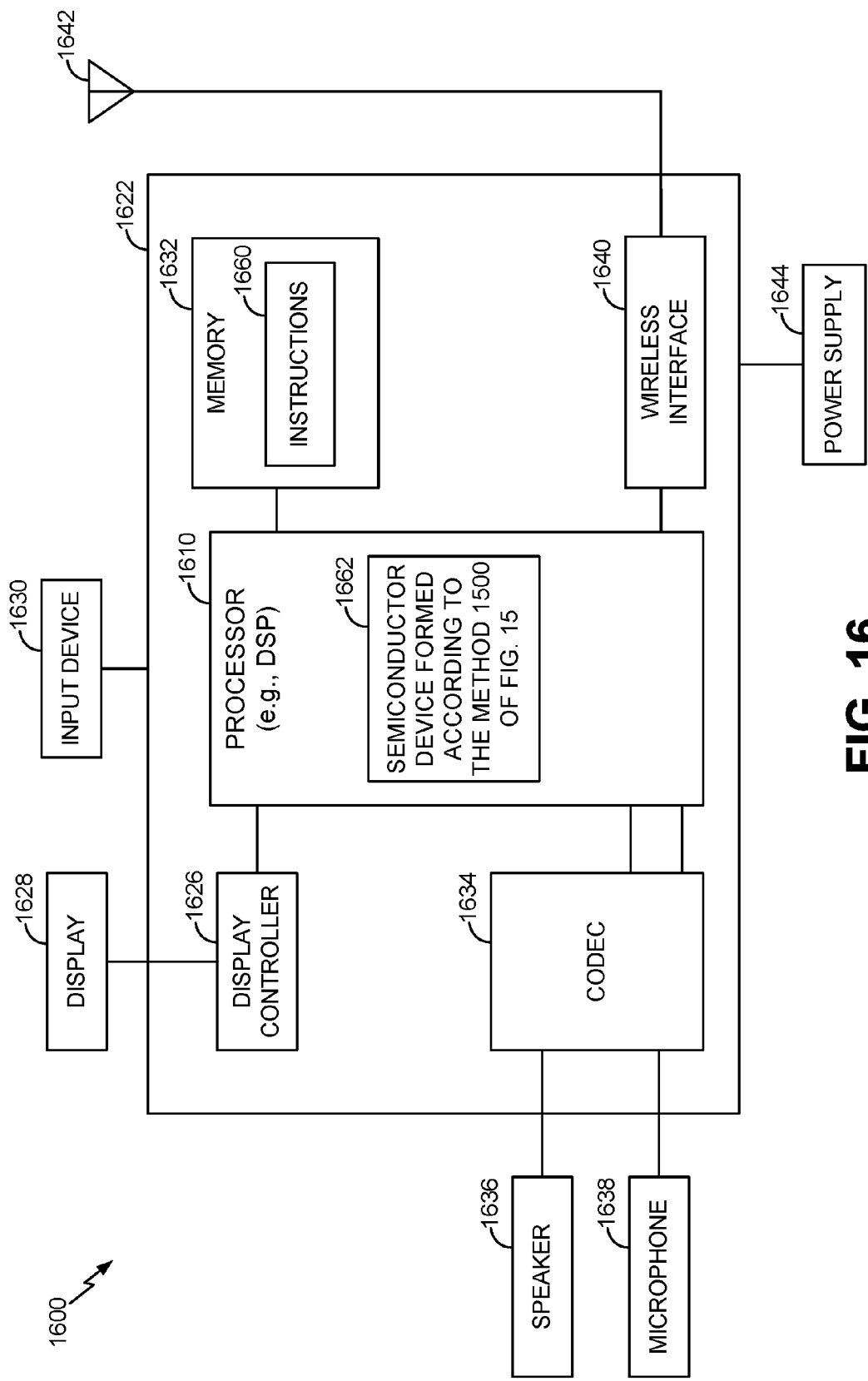
FIG. 16 is a block diagram that illustrates communication device including a semiconductor device formed according to the method of FIG. 15.

Referring to FIG. 16, a block diagram of a particular illustrative embodiment of a wireless communication device 1600 is depicted. The device 1600 may include at least one semiconductor device 1662 formed according to at least one of the processes illustrated by FIGS. 1-14 using the method 1500 of FIG. 15.

The device 1600 includes a processor 1610, such as a digital signal processor (DSP), coupled to a memory 1632. The processor 1610 may include the semiconductor device 1662. For example, the semiconductor device 1662 may be a semiconductor device formed according to at least one of the processes illustrated by FIGS. 1-14 using the method 1500 of FIG. 15.

The memory 1632 includes instructions 1660 (e.g., executable instructions) such as computer-readable instructions or processor-readable instructions. The instructions 1660 may include one or more instructions that are executable by a computer, such as the processor 1610.

FIG. 16 also illustrates a display controller 1626 may be coupled to the processor 1610 and to a display 1628. A coder/decoder (CODEC) 1634 may be coupled to the processor 1610. A speaker 1636 and a microphone 1638 may be coupled to the CODEC 1634.

FIG. 16 also illustrates that a wireless interface 1640, such as a wireless controller, may be coupled to the processor 1610 and to an antenna 1642, such that wireless data received via the antenna 1642 and the wireless interface 1640 may be provided to the processor 1610. In a particular embodiment, the processor 1610, the display controller 1626, the memory 1632, the CODEC 1634, and the wireless interface 1640 are included in a system-in-package or system-on-chip device 1622. An input device 1630 and a power supply 1644 may be coupled to the system-on-chip device 1622. Moreover, in a particular embodiment, as illustrated in FIG. 16, the display 1628, the input device 1630, the speaker 1636, the microphone 1638, the antenna 1642, and the power supply 1644 are external to the system-on-chip device 1622. However, each of the display 1628, the input device 1630, the speaker 1636, the microphone 1638, the antenna 1642, and the power supply 1644 may be coupled to a component of the system-on-chip device 1622, such as an interface or a controller. Although the semiconductor device 1662 is depicted as being included in the processor 1610, the semiconductor device 1662 may be included in another component of the device 1600 or a component coupled to the device 1600. For example, the semiconductor device 1662 may be included in the memory 1632, the wireless interface 1640, the power supply 1644, the input device 1630, the display 1628, the display controller 1626, the CODEC 1634, the speaker 1636, or the microphone 1638.

In conjunction with one or more of the described embodiments of FIGS. 1-16, an apparatus is disclosed that may include means for providing a first etch mask coupled to a dielectric material of a semiconductor device. The means for providing the first etch mask may correspond to the first hardmask layer 104 of FIGS. 1-14, one or more other devices or structures configured to provide an etch mask, or any combination thereof, and the dielectric material may correspond to the dielectric material 102 of FIGS. 1-14. The apparatus may include means for transferring a first pattern to the means for providing the first etch mask. The means for transferring the first pattern may be coupled to the means for providing the first etch mask. A top portion of the means for transferring the first pattern may be exposed. The means for transferring the first pattern may correspond to first mandrel 108 of FIGS. 1, 3-8, 10A-B, 11-12, and 14, one or more other devices or structures configured to transfer a first pattern to the means for providing the first etch mask, or any combination thereof.

The apparatus may also include means for transferring a second pattern to the means for providing the first etch mask. The means for transferring the second pattern may be coupled to the means for providing the first etch mask. The means for transferring the second pattern may be adjacent to the means for transferring the first pattern. The means for transferring the second pattern may be the first sidewall structure 112 of FIGS. 1, 4-5, 10A, and 14, one or more other devices or structures configured to transfer a second pattern to the means for providing the first etch mask, or any combination thereof. The apparatus may also include means for providing a second etch mask coupled to the means for providing the first etch mask. The means for providing the second etch mask may be adjacent to the means for transferring the first pattern and to the means for transferring the second pattern. The means for providing the second etch mask may be the second hardmask layer 106 of FIGS. 1, 5-8, and 10A-B, 11-12, one or more other devices or structures configured to provide a second etch mask, or any combination thereof.

In conjunction with one or more of the described embodiments of FIGS. 1-16, a method is disclosed that may include a step for forming a second hardmask layer adjacent to a sidewall structure and adjacent to a mandrel of a semiconductor device, such as described in the method 1500 of FIG. 15 at 1502. A top portion of the mandrel may be exposed prior to formation of the second hardmask layer. The method may also include a step for removing the sidewall structure to expose a first portion of the first hardmask layer, such as described in the method 1500 of FIG. 15 at 1504. The method may also include a step for etching the first portion of the first hardmask layer to expose a second portion of a dielectric material, such as described in the method 1500 of FIG. 15 at 1506. The method may also include a step for etching the second portion of the dielectric material to form a trench, such as described in the method 1500 of FIG. 15 at 1508. The method may also include a step for forming a metal structure within the trench, such as described in the method 1500 of FIG. 15 at 1510.

One or more of the disclosed embodiments may be implemented in a system or an apparatus, such as the device 1600, that may include a communications device, a fixed location data unit, a mobile location data unit, a mobile phone, a cellular phone, a satellite phone, a computer, a tablet, a portable computer, or a desktop computer. Additionally, the device 1600 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 17:
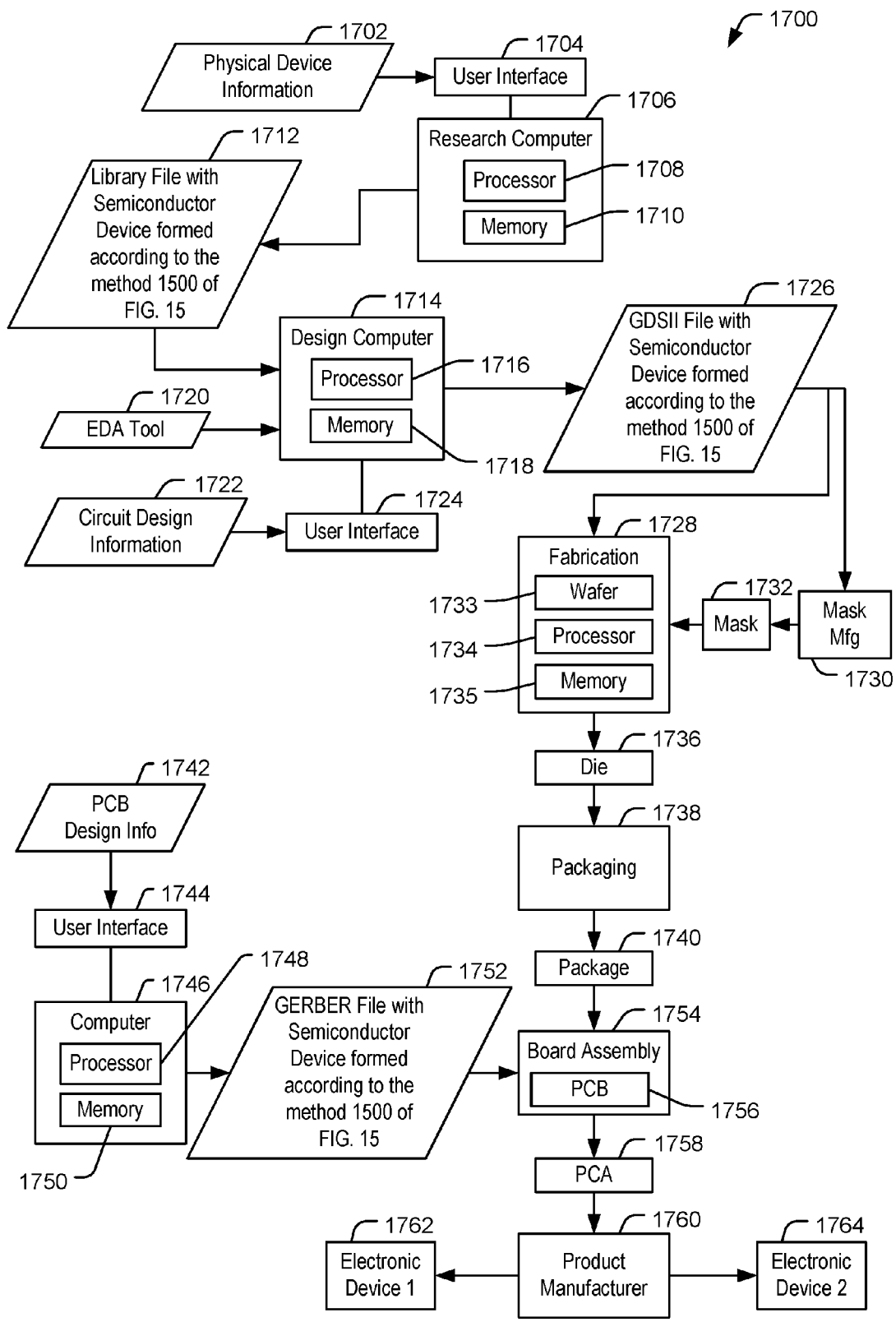
FIG. 17 is a data flow diagram that illustrates a particular illustrative embodiment of a manufacturing process to manufacture electronic devices that include a semiconductor device formed according to the method of FIG. 15.

The foregoing disclosed devices and functionalities may be designed and configured into computer files (e.g. RTL, GDSII, GERBER, etc.) stored on computer readable media. Some or all such files may be provided to fabrication handlers to fabricate devices based on such files. Resulting products include semiconductor wafers that are then cut into semiconductor dies and packaged into semiconductor chips. The semiconductor chips are then employed in devices described above. FIG. 17 depicts a particular illustrative embodiment of an electronic device manufacturing process 1700.

Physical device information 1702 is received at the manufacturing process 1700, such as at a research computer 1706. The physical device information 1702 may include design information representing at least one physical property of a semiconductor device, such as a semiconductor device formed according to one or more of the processes illustrated by FIGS. 1-14 using the method 1500 of FIG. 15. For example, the physical device information 1702 may include physical parameters, material characteristics, and structure information that is entered via a user interface 1704 coupled to the research computer 1706. The research computer 1706 includes a processor 1708, such as one or more processing cores, coupled to a computer readable medium (e.g., a non-transitory computer readable medium) such as a memory 1710. The memory 1710 may store computer readable instructions that are executable to cause the processor 1708 to transform the physical device information 1702 to comply with a file format and to generate a library file 1712.

In a particular embodiment, the library file 1712 includes at least one data file including the transformed design information. For example, the library file 1712 may include a library of semiconductor devices including a semiconductor device formed according to one or more of the processes illustrated by FIGS. 1-14 using the method 1500 of FIG. 15 that is provided for use with an electronic design automation (EDA) tool 1720.

The library file 1712 may be used in conjunction with the EDA tool 1720 at a design computer 1714 including a processor 1716, such as one or more processing cores, coupled to a memory 1718. The EDA tool 1720 may be stored as processor executable instructions at the memory 1718 to enable a user of the design computer 1714 to design a circuit including a semiconductor device formed according to one or more of the processes illustrated by FIGS. 1-14 using the method 1500 of FIG. 15 of the library file 1712. For example, a user of the design computer 1714 may enter circuit design information 1722 via a user interface 1724 coupled to the design computer 1714. The circuit design information 1722 may include design information representing at least one physical property of a semiconductor device, such as a semiconductor device formed according to one or more of the processes illustrated by FIGS. 1-14 using the method 1500 of FIG. 15. To illustrate, the circuit design property may include identification of particular circuits and relationships to other elements in a circuit design, positioning information, feature size information, interconnection information, or other information representing a physical property of a semiconductor device.

The design computer 1714 may be configured to transform the design information, including the circuit design information 1722, to comply with a file format. To illustrate, the file formation may include a database binary file format representing planar geometric shapes, text labels, and other information about a circuit layout in a hierarchical format, such as a Graphic Data System (GDSII) file format. The design computer 1714 may be configured to generate a data file including the transformed design information, such as a GDSII file 1726 that includes information describing a semiconductor device formed according to one or more of the processes illustrated by FIGS. 1-14 using the method 1500 of FIG. 15, in addition to other circuits or information. To illustrate, the data file may include information corresponding to a system-on-chip (SOC) that includes a semiconductor device formed according to one or more of the processes illustrated by FIGS. 1-14 using the method 1500 of FIG. 15 and that also includes additional electronic circuits and components within the SOC.

The GDSII file 1726 may be received at a fabrication process 1728 to manufacture a semiconductor device according to one or more of the processes illustrated by FIGS. 1-14 using the method 1500 of FIG. 15, according to transformed information in the GDSII file 1726. For example, a device manufacture process may include providing the GDSII file 1726 to a mask manufacturer 1730 to create one or more masks, such as masks to be used with photolithography processing, illustrated as a representative mask 1732. The mask 1732 may be used during the fabrication process to generate one or more wafers 1733, which may be tested and separated into dies, such as a representative die 1736. The die 1736 includes a circuit including a semiconductor device formed according to one or more of the processes illustrated by FIGS. 1-14 using the method 1500 of FIG. 15.

For example, the fabrication process 1728 may include a processor 1734 and a memory 1735 to initiate and/or control the fabrication process 1728. The memory 1735 may include executable instructions such as computer-readable instructions or processor-readable instructions. The executable instructions may include one or more instructions that are executable by a computer such as the processor 1734.

The fabrication process 1728 may be implemented by a fabrication system that is fully automated or partially automated. For example, the fabrication process 1728 may be automated according to a schedule. The fabrication system may include fabrication equipment (e.g., processing tools) to perform one or more operations to form a semiconductor device. For example, the fabrication equipment may be configured to form one or more mandrels, to form one or more sidewall structures, to form one or more hardmask layers, to remove one or more mandrels or one or more sidewall structures, to perform one or more etches, to form one or more metal structures, etc.

The fabrication system (e.g., an automated system that performs the fabrication process 1728) may have a distributed architecture (e.g., a hierarchy). For example, the fabrication system may include one or more processors, such as the processor 1734, one or more memories, such as the memory 1735, and/or controllers that are distributed according to the distributed architecture. The distributed architecture may include a high-level processor that controls or initiates operations of one or more low-level systems. For example, a high-level portion of the fabrication process 1728 may include one or more processors, such as the processor 1734, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 1734.

Alternatively, the processor 1734 may be a part of a high-level system, subsystem, or component of the fabrication system. In another embodiment, the processor 1734 includes distributed processing at various levels and components of a fabrication system.

Thus, the processor 1734 may include processor-executable instructions that, when executed by the processor 1734, cause the processor 1734 to initiate or control formation of a semiconductor device, the semiconductor device formed by forming a second hardmask layer adjacent to a sidewall structure and adjacent to a mandrel of the semiconductor device. For example, the second hardmask layer may be formed by one or more deposition tools, such as a flowable chemical vapor deposition (FCVD) tool or a spin-on deposition tool. A top portion of the mandrel may be exposed prior to formation of the second hardmask layer. Execution of the processor-executable instructions may also cause the processor 1734 to initiate or control removing the sidewall structure to expose a first portion of a first hardmask layer. For example, the sidewall structure may be removed by one or more etchers, such as a wet etcher, a dry etcher, or a plasma etcher, or one or more dissolving tools, such as a developer or developing tool. Execution of the processor-executable instructions may also cause the processor 1734 to initiate or control etching the first portion of the first hardmask layer to expose a second portion of a dielectric material. For example, the first portion of the first hardmask layer may be etched by one or more etching machines or etchers, such as a wet etcher, a dry etcher, or a plasma etcher. Execution of the processor-executable instructions may also cause the processor 1734 to initiate or control etching the second portion of the dielectric material to form a trench. For example, the second portion of the dielectric material layer may be etched by one or more etching machines or etchers, such as a wet etcher, a dry etcher, or a plasma etcher. Execution of the processor-executable instructions may also cause the processor 1734 to initiate or control forming a metal structure in the trench. For example, the metal structure may be formed by one or more plating platforms, platers, or any other plating equipment or tool configured to perform metal plating of a semiconductor device.

The executable instructions included in the memory 1735 may enable the processor 1734 to initiate formation of a semiconductor device such as a semiconductor device formed according to one or more of the processes illustrated by FIGS. 1-14 using the method 1500 of FIG. 15. In a particular embodiment, the memory 1735 is a non-transitory computer readable medium storing processor-executable instructions that are executable by the processor 1734 to cause the processor 1734 to initiate formation of a semiconductor device in accordance with one or more of the processes illustrated by FIGS. 1-14 using the method 1500 of FIG. 15. For example, the processor-executable instructions may be executable to cause the processor 1734 to initiate formation of a semiconductor device. The semiconductor device may be formed by forming a second hardmask layer adjacent to a sidewall structure and adjacent to a mandrel of the semiconductor device, removing the sidewall structure to expose a first portion of a first hardmask layer, etching the first portion of the first hardmask layer to expose a second portion of a dielectric material, etching the second portion of the dielectric material to form a trench, and forming a metal structure in the trench. A top portion of the mandrel may be exposed prior to formation of the second hardmask layer.

As an illustrative example, the processor 1734 may control a step for forming a second hardmask layer adjacent to a sidewall structure and adjacent to a mandrel of the semiconductor device. A top portion of the mandrel may be exposed prior to formation of the second hardmask layer. For example, the processor 1734 may be embedded in or coupled to one or more controllers that control one or more pieces of fabrication equipment to perform the step for forming the second hardmask layer adjacent to the sidewall structure and adjacent to the mandrel of the semiconductor device. The processor 1734 may control the step for forming the second hardmask layer by controlling one or more processes as described in the method 1500 of FIG. 15 at 1502, by controlling formation of a particular hardmask layer, by controlling one or more other processes configured to form the second hardmask layer adjacent to the sidewall structure and adjacent to the mandrel of the semiconductor device, or any combination thereof.

The processor 1734 may also control a step for removing the sidewall structure to expose a first portion of a first hardmask layer. The processor 1734 may control the step for removing the sidewall structure by controlling one or more processes as described in the method 1500 of FIG. 15 at 1504, by controlling removal of a sidewall structure, by controlling one or more other processes configured to remove the sidewall structure to expose the first portion of the first hardmask layer, or any combination thereof. The processor 1734 may also control a step for etching the first portion of the first hardmask layer to expose a second portion of a dielectric material. The processor 1734 may control the step for etching the first portion of the first hardmask layer by controlling one or more processes as described in the method 1500 of FIG. 15 at 1506, by controlling performance of a first etch, by controlling one or more other processes configured to etch the first portion of the first hardmask layer to expose the second portion of the dielectric material, or any combination thereof. The processor 1734 may also control a step for etching the second portion of the dielectric material to form a trench. The processor 1734 may control the step for etching the second portion of the dielectric material by controlling one or more processes as described in the method 1500 of FIG. 15 at 1508, by controlling performance of a second etch, by controlling one or more other processes configured to etch the second portion of the dielectric material to form the trench, or any combination thereof. The processor 1734 may also control a step for forming a metal structure within the trench. The processor 1734 may control the step for forming the metal structure by controlling one or more processes as described in the method 1500 of FIG. 15 at 1510, by controlling formation of a metal structure, by controlling one or more other processes configured to form the metal structure within the trench, or any combination thereof.

The die 1736 may be provided to a packaging process 1738 where the die 1736 is incorporated into a representative package 1740. For example, the package 1740 may include the single die 1736 or multiple dies, such as a system-in-package (SiP) arrangement. The package 1740 may be configured to conform to one or more standards or specifications, such as Joint Electron Device Engineering Council (JEDEC) standards.

Information regarding the package 1740 may be distributed to various product designers, such as via a component library stored at a computer 1746. The computer 1746 may include a processor 1748, such as one or more processing cores, coupled to a memory 1750. A printed circuit board (PCB) tool may be stored as processor executable instructions at the memory 1750 to process PCB design information 1742 received from a user of the computer 1746 via a user interface 1744. The PCB design information 1742 may include physical positioning information of a packaged semiconductor device on a circuit board, the packaged semiconductor device corresponding to the package 1740 including a semiconductor device formed according to one or more of the processes illustrated by FIGS. 1-14 using the method 1500 of FIG. 15.

The computer 1746 may be configured to transform the PCB design information 1742 to generate a data file, such as a GERBER file 1752 with data that includes physical positioning information of a packaged semiconductor device on a circuit board, as well as layout of electrical connections such as traces and vias, where the packaged semiconductor device corresponds to the package 1740 including a semiconductor device formed according to one or more of the processes illustrated by FIGS. 1-14 using the method 1500 of FIG. 15. In other embodiments, the data file generated by the transformed PCB design information may have a format other than a GERBER format.

The GERBER file 1752 may be received at a board assembly process 1754 and used to create PCBs, such as a representative PCB 1756, manufactured in accordance with the design information stored within the GERBER file 1752. For example, the GERBER file 1752 may be uploaded to one or more machines to perform various steps of a PCB production process. The PCB 1756 may be populated with electronic components including the package 1740 to form a representative printed circuit assembly (PCA) 1758.

The PCA 1758 may be received at a product manufacture process 1760 and integrated into one or more electronic devices, such as a first representative electronic device 1762 and a second representative electronic device 1764. As an illustrative, non-limiting example, the first representative electronic device 1762, the second representative electronic device 1764, or both, may include a communications device, a fixed location data unit, a mobile location data unit, a mobile phone, a cellular phone, a satellite phone, a computer, a tablet, a portable computer, or a desktop computer. Additionally, the device 1600 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which a semiconductor device formed according to one or more of the processes illustrated by FIGS. 1-14 using the method 1500 of FIG. 15 is integrated. As another illustrative, non-limiting example, one or more of the electronic devices 1762 and 1764 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 17 illustrates remote units according to teachings of the disclosure, the disclosure is not limited to these illustrated units. Embodiments of the disclosure may be suitably employed in any device which includes active integrated circuitry including memory and on-chip circuitry.

A device that includes a semiconductor device formed according to one or more of the processes illustrated by FIGS. 1-14 using the method 1500 of FIG. 15 may be fabricated, processed, and incorporated into an electronic device, as described in the illustrative process 1700. One or more aspects of the embodiments disclosed with respect to FIGS. 1-16 may be included at various processing stages, such as within the library file 1712, the GDSII file 1726, and the GERBER file 1752, as well as stored at the memory 1710 of the research computer 1706, the memory 1718 of the design computer 1714, the memory 1750 of the computer 1746, the memory of one or more other computers or processors (not shown) used at the various stages, such as at the board assembly process 1754, and also incorporated into one or more other physical embodiments such as the mask 1732, the die 1736, the package 1740, the PCA 1758, other products such as prototype circuits or devices (not shown), or any combination thereof. Although various representative stages are depicted with reference to FIGS. 1-17, in other embodiments fewer stages may be used or additional stages may be included. Similarly, the process 1700 of FIG. 17 may be performed by a single entity or by one or more entities performing various stages of the process 1700.

Although one or more of FIGS. 1-17 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a semiconductor device comprising:
a first hardmask layer coupled to a dielectric material of the semiconductor device;
a first mandrel coupled to the first hardmask layer, wherein a top portion of the first mandrel is exposed;
a first sidewall structure coupled to the first hardmask layer;
a second sidewall structure coupled to the first hardmask layer, and a second mandrel coupled to the first hardmask layer and positioned between the first sidewall structure and the second sidewall structure, wherein a second distance from a third side of the second mandrel to a fourth side of the second mandrel is different from a first distance from a first side of the first mandrel to a second side of the first mandrel, wherein the first sidewall structure is in contact with the third side, wherein the second sidewall structure is in contact with the fourth side, wherein the first sidewall structure has a first thickness, and wherein the second sidewall structure has a second thickness different from the first thickness.

2. The apparatus of claim 1, wherein the top portion of the first mandrel is opposite to a bottom surface of the first mandrel that is in contact with the first hardmask layer.

3. The apparatus of claim 1, wherein the semiconductor device further comprises multiple mandrels, wherein the multiple mandrels include the first mandrel, the second mandrel, and a third mandrel.

4. The apparatus of claim 1, wherein the first mandrel is comprised of a single layer of a material, and wherein the second mandrel is comprised of the single layer of the material.

5. The apparatus of claim 1, wherein the semiconductor device further comprises:
a third sidewall structure in contact with the first side of the first mandrel; and
a fourth sidewall structure in contact with the second side of the first mandrel.

6. The apparatus of claim 1, wherein the first distance is less than the second distance.

7. The apparatus of claim 1, wherein the first thickness is less than the second thickness.

8. An apparatus comprising:
a semiconductor device comprising:
a first hardmask layer coupled to a dielectric material of the semiconductor device;
a first mandrel coupled to the first hardmask layer, wherein a top portion of the first mandrel is exposed;
a first sidewall structure coupled to the first hardmask layer;
a second sidewall structure coupled to the first hardmask layer, and a second mandrel coupled to the first hardmask layer and positioned between the first sidewall structure and the second sidewall structure, wherein a second distance from a third side of the second mandrel to a fourth side of the second mandrel is different from a first distance from a first side of the first mandrel to a second side of the first mandrel, wherein the first sidewall structure is in contact with the third side, wherein the second sidewall structure is in contact with the fourth side;
a third sidewall structure in contact with the second side of the first mandrel;
a second hardmask layer coupled to the first hardmask layer, wherein the second hardmask layer is positioned between the first sidewall structure and the third sidewall structure, and wherein the second hardmask layer comprises silicon dioxide ($SiO_2$).

9. The apparatus of claim 8, wherein the first hardmask layer and the second hardmask layer comprise different materials.

10. An apparatus comprising:
a semiconductor device comprising:
- a first hardmask layer coupled to a dielectric material of the semiconductor device;
- a first mandrel coupled to the first hardmask layer, wherein a top portion of the first mandrel is exposed;
- a first sidewall structure coupled to the first hardmask layer;
- a second sidewall structure coupled to the first hardmask layer, and a second mandrel coupled to the first hardmask layer and positioned between the first sidewall structure and the second sidewall structure, wherein a second distance from a third side of the second mandrel to a fourth side of the second mandrel is different from a first distance from a first side of the first mandrel to a second side of the first mandrel, wherein the first sidewall structure is in contact with the third side, and wherein the second sidewall structure is in contact with the fourth side; and
- a third sidewall structure in contact with the second side of the first mandrel and positioned between the first mandrel and a second hardmask layer coupled to the first hardmask layer.

11. An apparatus comprising:
a semiconductor device comprising:
- a first hardmask layer coupled to a dielectric material of the semiconductor device;
- a first mandrel coupled to the first hardmask layer, wherein a top portion of the first mandrel is exposed;
- a first sidewall structure coupled to the first hardmask layer;
- a second sidewall structure coupled to the first hardmask layer, and a second mandrel coupled to the first hardmask layer and positioned between the first sidewall structure and the second sidewall structure, wherein a second distance from a third side of the second mandrel to a fourth side of the second mandrel is different from a first distance from a first side of the first mandrel to a second side of the first mandrel, wherein the first sidewall structure is in contact with the third side, and wherein the second sidewall structure is in contact with the fourth side;
- third sidewall structure coupled to the first side of the first mandrel, wherein the third sidewall structure has a first thickness; and
- a fourth sidewall structure coupled to the second side of the first mandrel, wherein the fourth sidewall structure has a second thickness different from the first thickness.

12. An apparatus comprising:
a semiconductor device comprising:
- a first hardmask layer coupled to a dielectric material of the semiconductor device;
- a first mandrel coupled to the first hardmask layer, wherein a top portion of the first mandrel is exposed;
- a first sidewall structure coupled to the first hardmask layer;
- a second sidewall structure coupled to the first hardmask layer, and a second mandrel coupled to the first hardmask layer and positioned between the first sidewall structure and the second sidewall structure, wherein a second distance from a third side of the second mandrel to a fourth side of the second mandrel is different from a first distance from a first side of the first mandrel to a second side of the first mandrel, wherein the first sidewall structure is in contact with the third side, wherein the second sidewall structure is in contact with the fourth side; and
- a first portion of a second hardmask layer positioned between the second side of the first mandrel and the first sidewall structure.

13. An apparatus comprising:
a semiconductor device comprising:
- a first hardmask layer coupled to a dielectric material of the semiconductor device;
- a first mandrel coupled to the first hardmask layer, wherein a top portion of the first mandrel is exposed;
- a first sidewall structure coupled to the first hardmask layer;
- a second sidewall structure coupled to the first hardmask layer, and a second mandrel coupled to the first hardmask layer and positioned between the first sidewall structure and the second sidewall structure, wherein a second distance from a third side of the second mandrel to a fourth side of the second mandrel is different from a first distance from a first side of the first mandrel to a second side of the first mandrel, wherein the first sidewall structure is in contact with the third side, and wherein the second sidewall structure is in contact with the fourth side; and
- a third sidewall structure in contact with the first side of the first mandrel and positioned between the first mandrel and a first portion of a second hardmask layer, the first portion of the second hardmask layer in contact with the first hardmask layer.

14. The apparatus of claim 13, wherein the semiconductor device further comprises a fourth sidewall structure in contact with the second side of the first mandrel and positioned between a second portion of the second hardmask layer, the second portion of the second hardmask layer in contact with the first hardmask layer.

15. The apparatus of claim 14, wherein the second sidewall structure is positioned between the fourth side of the second mandrel and a third portion of the second hardmask layer, the third portion of the second hardmask layer in contact with the first hardmask layer.

* * * * *